(12) United States Patent
Lee et al.

(10) Patent No.: US 11,742,469 B2
(45) Date of Patent: Aug. 29, 2023

(54) SEMICONDUCTOR LIGHT-EMITTING DEVICE AND METHOD OF FABRICATING THE SAME

(71) Applicant: SAMSUNG ELECTRONICS CO., LTD., Suwon-si (KR)

(72) Inventors: Donggun Lee, Hwaseong-si (KR); Gibum Kim, Yongin-si (KR); Joosung Kim, Seongnam-si (KR); Juhyun Kim, Seoul (KR); Tan Sakong, Seoul (KR); Jonguk Seo, Hwaseong-si (KR); Youngjo Tak, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 270 days.

(21) Appl. No.: 17/036,090

(22) Filed: Sep. 29, 2020

(65) Prior Publication Data

US 2021/0159378 A1     May 27, 2021

(30) Foreign Application Priority Data

Nov. 26, 2019     (KR) ........................ 10-2019-0153550

(51) Int. Cl.
*H01L 33/62*     (2010.01)
*H01L 33/38*     (2010.01)
(Continued)

(52) U.S. Cl.
CPC ............ *H01L 33/62* (2013.01); *H01L 33/382* (2013.01); *H01L 33/486* (2013.01); *H01L 33/54* (2013.01)

(58) Field of Classification Search
CPC ... H01L 33/382; H01L 33/486; H01L 27/156; H01L 33/38; H01L 33/54; H01L 27/124; H01L 25/0753; H05B 33/145; F21K 9/20
See application file for complete search history.

(56) References Cited

U.S. PATENT DOCUMENTS 6,372,608 B1    4/2002    Shimoda et al.
6,645,830 B2   11/2003    Shimoda et al.
(Continued)

FOREIGN PATENT DOCUMENTS

CN      110021620 A   *   7/2019       ........... H01L 25/167
JP       2021019015 A   *   2/2021       ......... H01L 25/0753
(Continued)

OTHER PUBLICATIONS

Olivier et al, "Influence of size-reduction on the performances of GaN-based micro-LEDs for display application," Journal of Luminescence, 191, 112-116 (2017).
(Continued)

*Primary Examiner* — Antonio B Crite
(74) *Attorney, Agent, or Firm* — Lee IP Law, P.C.

(57) ABSTRACT

A semiconductor light-emitting device includes a plurality of light-emitting device structures separated from each other, each of the plurality of light-emitting device structures including a first conductivity type semiconductor layer, an active layer on the first conductivity type semiconductor layer, a second conductivity type semiconductor layer on the active layer, a first electrode connected to the first conductivity type semiconductor layer, and a second electrode connected to the second conductivity type semiconductor layer, and a partition wall structure between two adjacent light-emitting device structures of the plurality of light-emitting device structures, the partition wall structure defining a pixel space.

19 Claims, 24 Drawing Sheets

(51) Int. Cl.
*H01L 33/48* (2010.01)
*H01L 33/54* (2010.01)
*H01L 33/52* (2010.01)
*H01L 27/15* (2006.01)

(56) References Cited

U.S. PATENT DOCUMENTS

| | | | |
|---|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,954,177 B2 | 4/2018 | Ishisone et al. |
| 10,205,055 B2 | 2/2019 | Chu et al. |
| 10,276,631 B2 | 4/2019 | Gossler et al. |
| 10,438,994 B2 | 10/2019 | Yeon et al. |
| 10,566,318 B2 | 2/2020 | Lee et al. |
| 2018/0233496 A1 | 8/2018 | Yoo et al. |
| 2018/0301479 A1 | 10/2018 | Robin et al. |
| 2018/0374991 A1 | 12/2018 | Bour et al. |
| 2019/0088633 A1 | 3/2019 | Tao et al. |
| 2019/0189876 A1 | 6/2019 | Lee et al. |

FOREIGN PATENT DOCUMENTS

| | | | |
|---|---|---|---|
| KR | 20170024905 A | * 3/2017 | |
| KR | 20180068588 A | * 6/2018 | ............ H01L 27/15 |
| KR | 10-2018-0118090 A | 10/2018 | |

OTHER PUBLICATIONS

Dupre et al., "Processing and characterization of high resolution GaN/InGaN LED arrays at 10 micron pitch for micro display applications," Proceedings vol. 10104, Gallium Nitride Materials and Devices XII, 1010422 (2017).

* cited by examiner

SEMICONDUCTOR LIGHT-EMITTING DEVICE AND METHOD OF FABRICATING THE SAME

CROSS-REFERENCE TO RELATED APPLICATION

Korean Patent Application No. 10-2019-0153550, filed on Nov. 26, 2019, in the Korean Intellectual Property Office, and entitled: "Semiconductor Light-Emitting Device and Method of Fabricating the Same," is incorporated by reference herein in its entirety.

BACKGROUND

1. Field

Embodiments relate to a semiconductor light-emitting device and a method of manufacturing the same, and more particularly, to a semiconductor light-emitting device with excellent electrical properties, and a method of manufacturing the semiconductor light-emitting device.

2. Description of the Related Art

Techniques of applying semiconductor light-emitting devices to display devices have been attempted. For example, a display device may include a display panel and a backlight, e.g., a semiconductor light-emitting device may be used as one pixel in the backlight.

SUMMARY

According to an aspect of embodiments, there is provided a semiconductor light-emitting device including a plurality of light-emitting device structures separated from each other, and a partition wall structure between two adjacent light-emitting device structures of the plurality of light-emitting device structures, the partition wall structure defining a pixel space. Each of the plurality of light-emitting device structures includes a first conductivity type semiconductor layer, an active layer on the first conductivity type semiconductor layer, a second conductivity type semiconductor layer on the active layer, a first electrode connected to the first conductivity type semiconductor layer, and a second electrode connected to the second conductivity type semiconductor layer.

According to another aspect of embodiments, there is provided a semiconductor light-emitting device including a first conductivity type semiconductor layer, an active layer on the first conductivity type semiconductor layer, a second conductivity type semiconductor layer on the active layer, a first electrode connected to the first conductivity type semiconductor layer, an insulating layer with which side surfaces of the first conductivity type semiconductor layer, the active layer, and the second conductivity type semiconductor layer are coated, and a partition wall structure extending along the side surfaces of the first conductivity type semiconductor layer, the active layer, and the second conductivity type semiconductor layer with the insulating layer therebetween. The partition wall structure protrudes to a higher level than an upper surface of the second conductivity type semiconductor layer. The partition wall structure includes a partition wall body extending in a direction perpendicular to the upper surface of the second conductivity type semiconductor layer, and a seed layer extension protruding from a side surface of the partition wall body and extending along the upper surface of the second conductivity type semiconductor layer.

According to yet another aspect of embodiments, there is provided a semiconductor light-emitting device including a circuit substrate including a control circuit, a plurality of light-emitting device structures located on the circuit substrate and separated from each other, a partition wall structure located between two adjacent light-emitting device structures of the plurality of light-emitting device structures, the partition wall structure defining a pixel space, and an encapsulation layer in contact with an upper surface of each of the plurality of light-emitting device structures and a sidewall of the partition wall structure. Each of the plurality of light-emitting device structures includes a first conductivity type semiconductor layer on the circuit substrate, an active layer on the first conductivity type semiconductor layer, a second conductivity type semiconductor layer on the active layer, a first electrode connected to the first conductivity type semiconductor layer, and a second electrode connected to the second conductivity type semiconductor layer. Herein, side surfaces of the first conductivity type semiconductor layer, the active layer, and the second conductivity type semiconductor layer are coated with an insulating layer. The partition wall structure includes an electrical conductor and vertically extends along the side surfaces of the first conductivity type semiconductor layer, the active layer, and the second conductivity type semiconductor layer are coated with an insulating layer with the insulating layer therebetween. An upper surface of the partition wall structure is located farther from the circuit substrate than an upper surface of the second conductivity type semiconductor layer. A lower surface of the partition wall structure is located closer to the circuit substrate than a lower surface of the first conductivity type semiconductor layer. The partition wall structure surrounds each of the plurality of light-emitting device structures with the insulating layer therebetween.

According to still another aspect of embodiments, there is provided a method of manufacturing a semiconductor light-emitting device. The method includes forming a light-emitting device structure including a first conductivity type semiconductor layer, an active layer, and a second conductivity type semiconductor layer, forming a first electrode to be connected to the first conductivity type semiconductor layer, electrically connecting the first electrode to a circuit substrate including a control circuit, performing a device isolation process by sequentially etching the second conductivity type semiconductor layer, the active layer, and the first conductivity type semiconductor layer, forming an insulating layer on sidewalls of the second conductivity type semiconductor layer, the active layer, and the first conductivity type semiconductor layer on which the device isolation process has been performed, forming a seed layer on the insulating layer, and forming a partition wall body on the seed layer so that an upper surface of the partition wall body has a higher level than an upper surface of the second conductivity type semiconductor layer.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
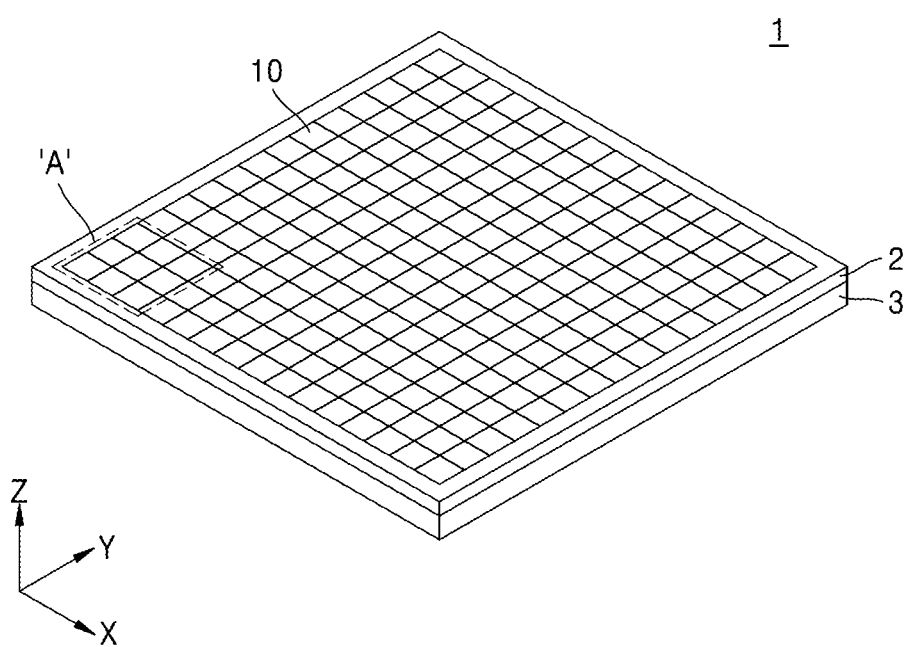
FIG. 1 is a schematic perspective view of a display device having a light-emitting device package according to an embodiment.
Figure 2:
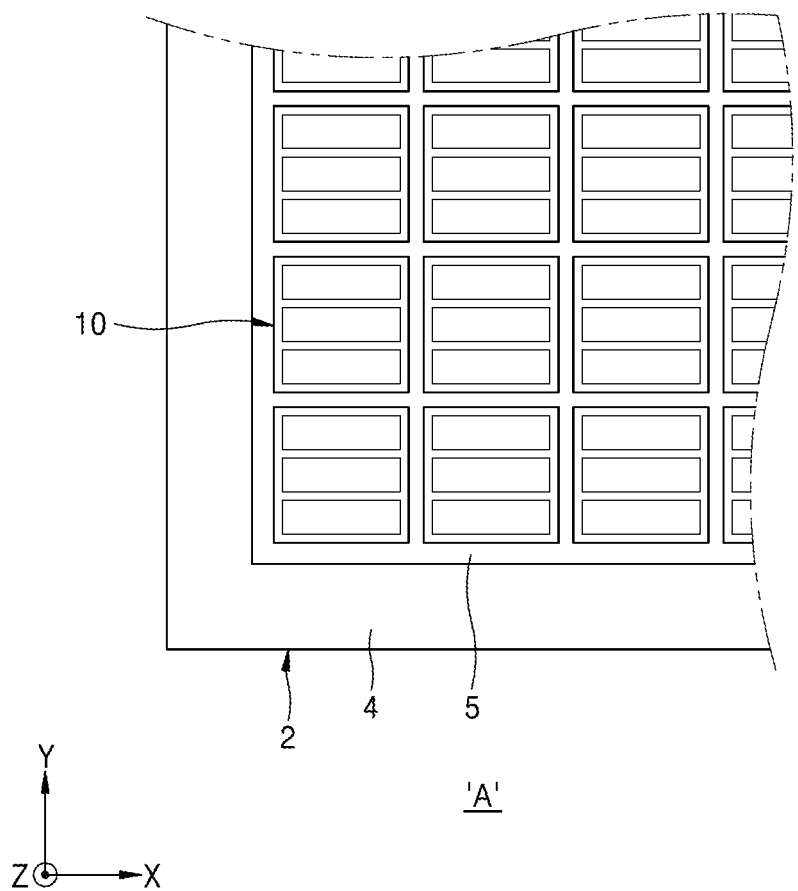
FIG. 2 is an enlarged plan view of region A of FIG. 1.

FIG. 1 is a schematic perspective view of a display device 1 having light-emitting device packages 10 according to an embodiment, and FIG. 2 is an enlarged plan view of region A of FIG. 1.

Referring to FIG. 1, the display device 1 may include a circuit substrate 3 and a display panel 2 arranged on the circuit substrate 3. A plurality of light-emitting device packages 10 may be arranged on the display panel 2.

In detail, the display panel 2 according to the present embodiment may include the plurality of the light-emitting device packages 10, which may emit a light mixture of red (R), green (G), and blue (B). Each of the plurality of light-emitting device packages 10 may constitute one pixel of the display panel 2. The plurality of light-emitting device packages 10 may be arranged in rows and columns on the circuit substrate 3, e.g., along the X and Y direction in a matric pattern. Although FIG. 1 of the present embodiment illustrates an arrangement of 15×15 light-emitting device packages 10 for brevity, light-emitting device packages may be actually arranged in a larger number than 15×15 (e.g., 1024×768 and 1920×1080) according to a required resolution.

Each of the light-emitting device packages 10 may include a plurality of sub-pixels corresponding to RGB light sources. A plurality of sub-pixels included in one light-emitting device package 10 may be arranged close to each other as described in detail with reference to FIGS. 3 to 7. However, colors of the sub-pixels are not limited to RGB, and various other colors, e.g., cyan, yellow, magenta, and black (CYMK), may be used. In addition, although the present embodiment describes an example in which one pixel includes three sub-pixels corresponding respectively to RGB light sources, embodiments are not limited thereto, e.g., one pixel may include four or more sub-pixels.

A driver configured to supply power to each of the light-emitting device packages 10 of the display panel 2 and a control circuit configured to control the driver may be arranged in the circuit substrate 3. The circuit substrate 3 may include a circuit configured to independently drive sub-pixels of each pixel. For example, the circuit substrate 3 may include a thin-film transistor (TFT) substrate including a TFT.

Referring to FIG. 2, the display panel 2 may further include a first partition wall structure 4 configured to define a region in which a plurality of light-emitting device packages 10 are arranged, e.g., the first partition wall structure 4 may frame (or surround an entire perimeter of) an entire region of the plurality of light-emitting device packages 10. Also, each of the plurality of light-emitting device packages 10 may be surrounded by a second partition wall structure 5. The second partition wall structure 5 may electrically isolate the light-emitting device packages 10 from each other so that each of the light-emitting device packages 10 may be independently driven as one pixel. Also, the second partition wall structure 5 may securely fix the plurality of light-emitting device packages 10 to the circuit substrate 3. However, the first and second partition wall structures 4 and 5 may be omitted according to embodiments.

The first and second partition wall structures 4 and 5 may include black matrices. For example, the black matrix may be arranged around the circuit substrate 3 and serve as a guideline that defines a region in which the plurality of light-emitting device packages 10 are mounted. The matrix is not limited to a black color, and matrices in other colors, e.g., a white matrix or a green matrix, may be used according to purposes and uses, e.g., a matrix including a transparent material may be used as needed. The white matrix may further include a reflective material or a scattering material. The black matrix may include at least one of, e.g., a polymer including a resin, a ceramic, a semiconductor, or a metal.

Figure 3:
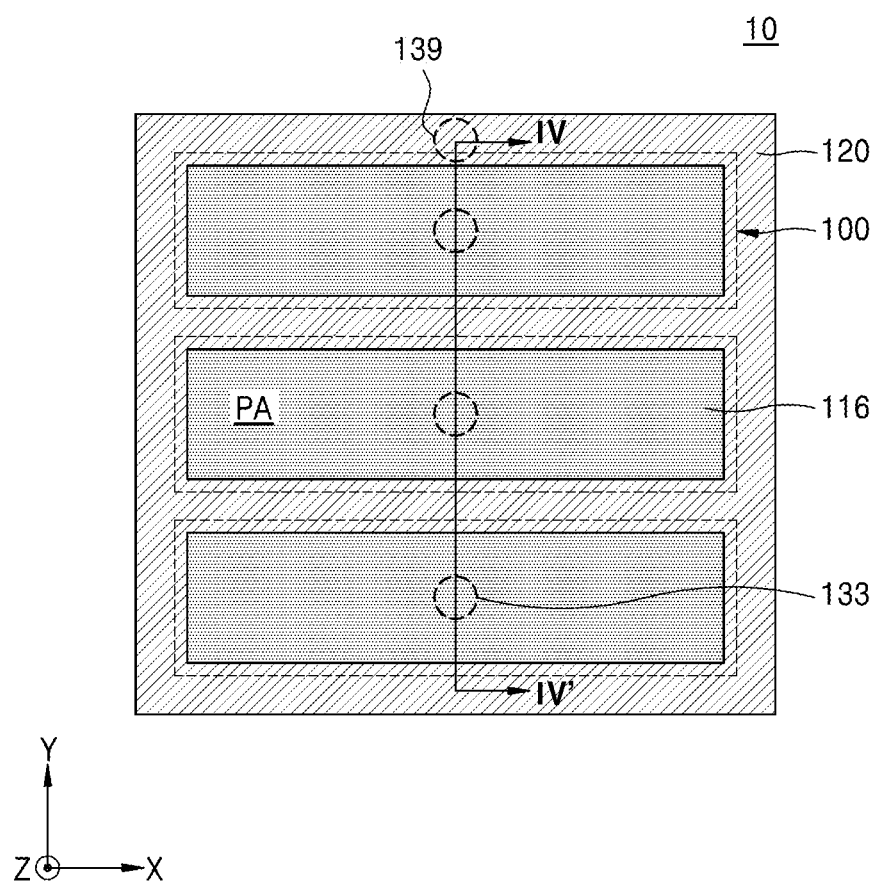
FIG. 3 is a schematic plan view of a light-emitting device package according to an embodiment.

FIG. 3 is a schematic plan view of the light-emitting device package 10 according to an embodiment.

Referring to FIG. 3, one light-emitting device package 10 may include a plurality of semiconductor light-emitting devices 100. Each of the plurality of semiconductor light-emitting devices 100 may function as a sub-pixel.

Although FIG. 3 illustrates a case in which one light-emitting device package 10 includes three sub-pixels (i.e., three semiconductor light-emitting devices 100), the light-emitting device package 10 may include a larger number of sub-pixels than three sub-pixels. The plurality of semiconductor light-emitting devices 100 may be separated from each other by a partition wall structure 120. The partition wall structure 120 may be configured to define one pixel area PA on one second conductivity type semiconductor layer 116. The partition wall structure 120, which includes a conductor, may act as one common electrode of the semiconductor light-emitting devices 100 as will be described in further detail below. It is noted that the partition wall structure 120 corresponds to the second partition wall structure 5 in FIG. 2.

Figure 4:
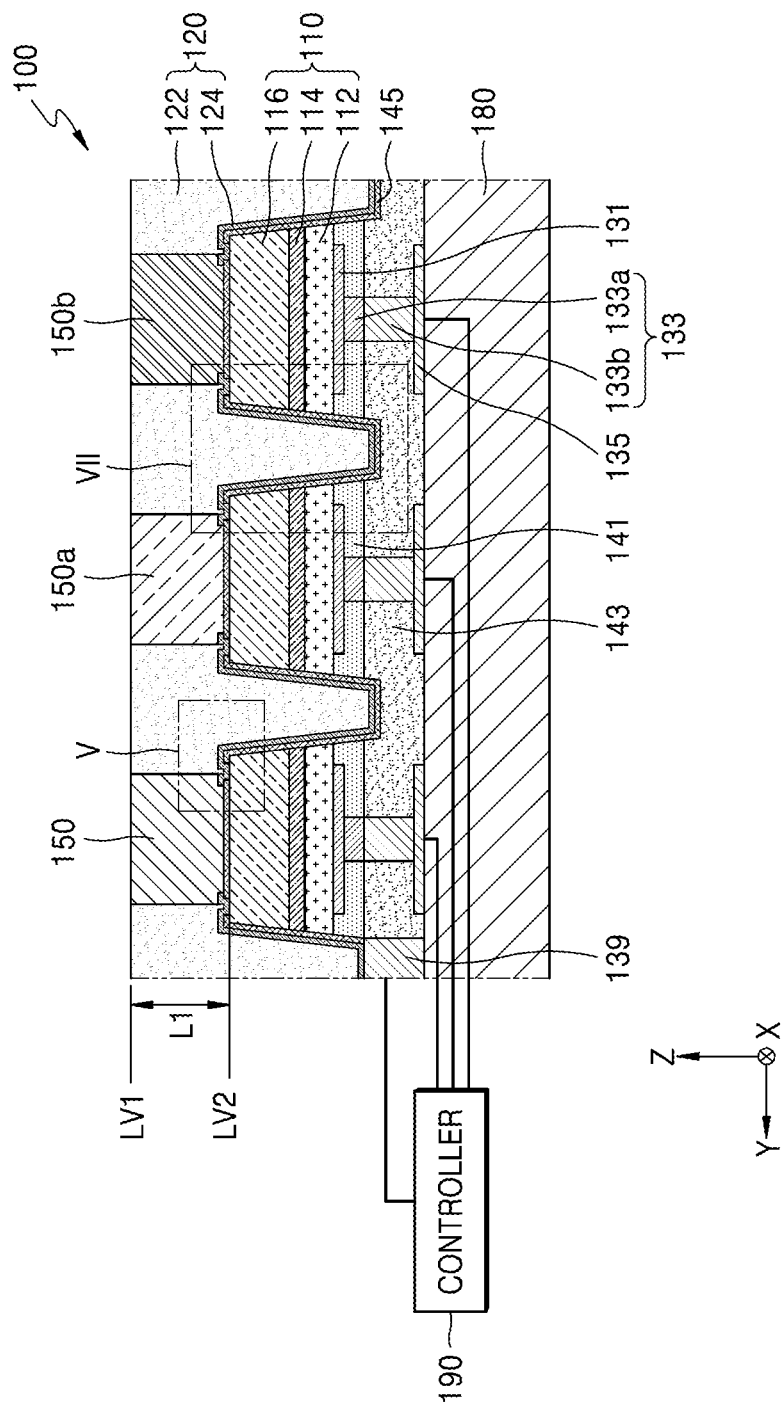
FIG. 4 is a cross-sectional along line IV-IV' in FIG. 3.

FIG. 4 is a cross-sectional view of the light-emitting device package 10, which is taken along a line IV-IV' of FIG. 3.

Referring to FIG. 4, the light-emitting device package 10 may include three semiconductor light-emitting devices 100. For example, as illustrated in FIG. 4, the three semiconductor light-emitting devices 100 may be spaced apart from each other along the Y direction.

Each of the semiconductor light-emitting devices 100 may include a light-emitting device structure 110 in which a first conductivity type semiconductor layer 112, an active layer 114, and a second conductivity type semiconductor layer 116 are stacked, e.g., along the Z direction The first conductivity type semiconductor layer 112 may include a nitride semiconductor layer having a composition of p-type $In_xAl_yGa_{(1-x-y)}N$ ($0 \leq x < 1$, $0 \leq y < 1$, and $0 \leq x+y < 1$), and the p-type impurities may be, e.g., magnesium (Mg). For example, although the first conductivity type semiconductor layer 112 may be embodied as a single structure, the first conductivity type semiconductor layer 112 may have a multilayered structure including different compositions as in the present example embodiment. In some embodiments, the first conductivity type semiconductor layer 112 may include an electron blocking layer (EBL), a low-concentration p-type GaN layer, and a high-concentration p-type GaN layer provided as a contact layer. For example, the EBL may have a structure in which a plurality of $In_xAl_yGa_{(1-x-y)}N$ layers ($0 \leq x$, $y \leq 1$, and $0 \leq x+y \leq 1$) having thicknesses of about 5 nm to about 100 nm and having different compositions are alternately stacked, or may be a single layer including $Al_yGa_{(1-y)}N$ ($0 \leq y \leq 1$). An energy band gap Eg of the EBL may be reduced as a distance from the active layer 114 increases. For example, an Al content of the EBL may be reduced as the distance from the active layer 114 increases.

The active layer 114 may have a multiple quantum well (MQW) structure in which a quantum well layer and a quantum barrier layer are alternately stacked. For example, the quantum well layer and the quantum barrier layer may include $In_xAl_yGa_{(1-x-y)}N$ ($0 \leq x \leq 1$, $0 \leq y \leq 1$, and $0 \leq x+y \leq 1$) having different compositions. In a specific example, the quantum well layer may include $In_xGa_{1-x}N$ ($0 \leq x \leq 1$), and the quantum barrier layer may include GaN or AlGaN. A thickness of each of the quantum well layer and the quantum barrier layer may be in the range of about 1 nm to about 50 nm. The active layer 114 is not limited to the MQW structure, and may have a single quantum well structure.

The second conductivity type semiconductor layer 116 may include a nitride semiconductor having a composition of n-type $In_xAl_yGa_{(1-x-y)}N$ ($0 \leq x < 1$, $0 \leq y < 1$, and $0 \leq x+y < 1$), and the n-type impurities may be, e.g., silicon (Si). For example, the second conductivity type semiconductor layer 116 may include GaN including n-type impurities.

In the present embodiment, the second conductivity type semiconductor layer 116 may include a second conductivity type semiconductor contact layer and a current diffusion layer. The impurity concentration of the second conductivity type semiconductor contact layer may be in the range of about $2 \times 10^{18}$ cm$^{-3}$ to about $9 \times 10^{19}$ cm$^{-3}$. A thickness of the second conductivity type semiconductor contact layer may range from about 1 µm to about 5 µm. The current diffusion layer may have a structure in which a plurality of $In_xAl_yGa_{(1-x-y)}N$ layers ($0 \leq x$, $y \leq 1$, and $0 \leq x+y \leq 1$) having different compositions or having different impurity contents are alternately stacked. For example, the current diffusion layer may have an n-type superlattice structure in which an n-type GaN layer having a thickness of about 1 nm to about 500 nm and/or at least two $Al_xIn_yGa_zN$ layers ($0 \leq x,y,z \leq 1$ and $x+y+z \neq 0$) having different compositions are alternately stacked. The impurity concentration of the current diffusion layer may range from about $2 \times 10^{18}$ cm$^{-3}$ to about $9 \times 10^{19}$ cm$^{-3}$. When necessary, the current diffusion layer may further include an insulating material layer.

The semiconductor light-emitting device 100 may further include an insulating layer 145. The insulating layer 145 may coat sidewalls of the first conductivity type semiconductor layer 112, the active layer 114, and the second conductivity type semiconductor layer 116. For example, as illustrated in FIG. 4, the insulating layer 145 may be continuous and conformal on sidewalls of the semiconductor light-emitting device 100 (dark-colored layer on sidewalls of the semiconductor light-emitting devices 100 in FIG. 4), such that sidewalls of the first conductivity type semiconductor layer 112, the active layer 114, and the second conductivity type semiconductor layer 116 are coated.

The insulating layer 145 may conformally extend along the sidewalls of the first conductivity type semiconductor layer 112, the active layer 114, and the second conductivity type semiconductor layer 116. For example, the insulating layer 145 may include silicon oxide, silicon nitride, silicon oxynitride, or a combination thereof. Although the insulating layer 145 is illustrated as a single layer in FIG. 4, in some embodiments, the insulating layer 145 may have a multi-layered structure in which a plurality of insulating layers are stacked.

A first electrode 131 may be provided under the first conductivity type semiconductor layer 112. The first electrode 131 may be electrically connected to a lower surface of the first conductivity type semiconductor layer 112. In some embodiments, the first electrode 131 may be in direct contact with the lower surface of the first conductivity type semiconductor layer 112.

The first electrode 131 may include, e.g., silver (Ag), aluminum (Al), nickel (Ni), chromium (Cr), copper (Cu), gold (Au), palladium (Pd), platinum (Pt), tin (Sn), tungsten (W), rhodium (Rh), iridium (Ir), ruthenium (Ru), magnesium (Mg), zinc (Zn) and a combination thereof. The first electrode 131 may include a metal material having a high reflectance. For example, the formation of the first electrode 131 may include exposing a surface of the first conductivity type semiconductor layer 112 and depositing a conductive material on the exposed surface of the first conductivity type semiconductor layer 112. Optionally, an ohmic electrode may be further formed between the first electrode 131 and the first conductivity type semiconductor layer 112.

The first electrode 131 may be electrically connected to a first contact 133. In some embodiments, the first electrode 131 may be in direct contact with the first contact 133. The first contact 133 may be connected to a first connection electrode 135 of a circuit substrate 180. The first contact 133 may extend in a direction perpendicular to an upper surface of the circuit substrate 180. It is noted that the circuit substrate 180 corresponds to the circuit substrate 3 in FIG. 1.

In some embodiments, the first contact 133 may include an upper sub-contact 133a located relatively close to the first conductivity type semiconductor layer 112 and a lower sub-contact 133b located relatively close to the circuit substrate 180. In some embodiments, the upper sub-contact 133a may be integrated with the lower sub-contact 133b. In some embodiments, the first contact 133 may include an interface surface between the upper sub-contact 133a and the lower sub-contact 133b. In some embodiments, the first contact 133 may include at least one step portion located at a sidewall thereof. In some embodiments, the step portion may be formed at the interface surface between the upper sub-contact 133a and the lower sub-contact 133b.

In some embodiments, the first contact 133 may further include a connection conductor between the upper sub-contact 133a and the lower sub-contact 133b. In this case, the upper sub-contact 133a may be apart from the lower sub-contact 133b.

The first connection electrode 135 may be electrically connected to a control circuit of a controller 190 through an interconnection formed on the circuit substrate 180. As shown in FIG. 4, each of the semiconductor light-emitting devices 100 may include the first connection electrode 135, which is connected to the control circuit.

An upper surface of the second conductivity type semiconductor layer 116 may also be coated with the insulating layer 145. The insulating layer 145 may include an opening (i.e., element 145o in FIG. 5) partially exposing the second conductivity type semiconductor layer 116. The second conductivity type semiconductor layer 116 may be electrically connected to a second electrode (i.e., element 127 in FIG. 5) through the opening 145o. In some embodiments, the second conductivity type semiconductor layer 116 may be in direct contact with the second electrode 127. The second electrode 127 may be a portion of the partition wall structure 120, which will be described in further detail below.

The light-emitting device structure 110 may be located apart from the circuit substrate 180 by a first interlayer insulating film 141 and a second interlayer insulating film 143. The first interlayer insulating film 141 and the second interlayer insulating film 143 may include any insulating material or any insulating object having a material with a low light absorptance. For example, the first interlayer insulating film 141 and the second interlayer insulating film 143 may include silicon oxide or silicon nitride, e.g., $SiO_2$, $SiO_xN_y$, and $Si_xN_y$. When necessary, the first interlayer insulating film 141 and the second interlayer insulating film 143 may have a reflective structure in which a light-reflective filler is dispersed in a light transmissive material.

In another case, each of the first interlayer insulating film 141 and the second interlayer insulating film 143 may have a multilayered reflective structure in which a plurality of insulating films having different refractive indices are alternately stacked. For example, the multilayered reflective structure may be a distributed Bragg reflector (DBR) in which a first insulating film having a first refractive index and a second insulating film having a second refractive index are alternately stacked. In some embodiments, a refractive index of each of the first interlayer insulating film 141 and the second interlayer insulating film 143 may be about 1.4 to about 2.5.

The semiconductor light-emitting devices 100 may be separated from each other by the partition wall structure 120. The partition wall structure 120 may include a seed layer 124 and a partition wall body 122.

The seed layer 124 may extend to a substantially constant thickness along side surfaces of the first conductivity type semiconductor layer 112, the active layer 114, and the second conductivity type semiconductor layer 116 with the insulating layer 145 therebetween. For example, as illustrated in FIG. 4, the seed layer 124 may extend conformally along side surfaces of the first conductivity type semiconductor layer 112, the active layer 114, and the second conductivity type semiconductor layer 116, while the insulating layer 145 may separate between the seed layer 124 and each of the first conductivity type semiconductor layer 112, the active layer 114, and the second conductivity type semiconductor layer 116.

The partition wall body 122 may be electrically connected to the seed layer 124 and fill spaces between the plurality of semiconductor light-emitting devices 100. For example, as illustrated in FIG. 4, the partition wall body 122 may cover, e.g., entirely, outer surfaces of the seed layer 124.

Figure 5:
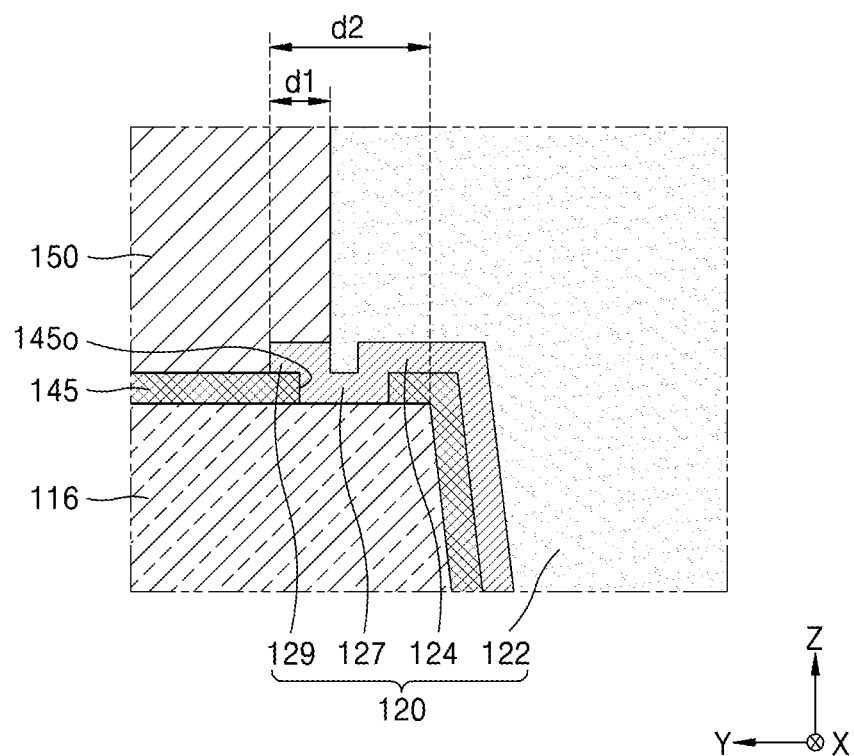
FIG. 5 is a detailed enlarged view of region V in FIG. 4.

FIG. 5 is a detailed enlarged view of region V of FIG. 4.

Referring to FIGS. 4 and 5, the partition wall body 122 may be located on the seed layer 124 and extend along the side surfaces of the first conductivity type semiconductor layer 112, the active layer 114, and the second conductivity type semiconductor layer 116 in a direction perpendicular to the upper surface of the circuit substrate 180, e.g., along the Z direction. The insulating layer 145 may be between each semiconductor light-emitting device 100 and the seed layer 124.

As illustrated in FIG. 4, the partition wall body 122 may extend in the perpendicular direction, e.g., along the Z direction, to protrude by a first height L1 from, e.g., above, the upper surface of the second conductivity type semiconductor layer 116. In some embodiments, the first height L1 may range from about 0.1 μm to about 50 μm.

In some embodiments, an upper surface of the partition wall body 122 may have a first level LV1. An upper surface of the second conductivity type semiconductor layer 116 may have a second level LV2 that is lower than the first level LV1, e.g., relative to a bottom of the circuit substrate 180. A difference between the first level LV1 and the second level LV2 may correspond to the first height L1.

The seed layer 124 may include, e.g., titanium (Ti), copper (Cu), chromium (Cr), tungsten (W), nickel (Ni), aluminum (Al), palladium (Pd), tin (Sn), gold (Au), or an alloy thereof. The seed layer 124 may be integrated with the second electrode 127 inside the opening 145o of the insulating layer 145, as illustrated in FIG. 5.

In detail, as illustrated in FIG. 4, the seed layer 124 may extend along the side surfaces of the first conductivity type semiconductor layer 112, the active layer 114, and the second conductivity type semiconductor layer 116, such that the insulating layer 145 is between the seed layer 124 and each of the first conductivity type semiconductor layer 112, the active layer 114, and the second conductivity type semiconductor layer 116. As further illustrated in FIG. 5, the seed layer 124 may extend by a predetermined length in a direction parallel to the top surface of the second conductivity type semiconductor layer 116, e.g., in the Y direction, along the top surface of the second conductivity type semiconductor layer 116.

As illustrated in FIG. 5, the second electrode 127 may be integral and continuous with the seed layer 124, and may extend from the seed layer 124 into the opening 145o of the insulating layer 145 to contact the top surface of the second conductivity type semiconductor layer 116. That is, the second electrode 127 may vertically extend along a first sidewall of the opening 145o of the insulating layer 145 e.g., along the Z direction, to be in contact with the upper surface of the second conductivity type semiconductor layer 116, which is exposed by the opening 145o. The second electrode 127 may extend along the exposed upper surface of the second conductivity type semiconductor layer 116 in a lateral direction inside the opening 145o, e.g., along the Y direction. The laterally extending portion may form the second electrode 127. Subsequently, the second electrode 127 may vertically extend along a second sidewall (opposite to the first sidewall) of the opening 145o of the insulating layer 145. For example, as illustrated in FIG. 5, the second electrode 127 may have a lateral horizontal portion between two vertical portions, e.g., to have a cross section of an inverted Π, such that the lateral horizontal portion completely fills the opening 145o of the insulating layer 145 and the vertical portions extend along sidewalls of the opening 145o.

In some embodiments, the opening 145o may be a via hole. In some other embodiments, the opening 145o may be a trench extending along an edge of the second conductivity type semiconductor layer 116 with a gap therebetween. Thus, the trench may be spaced apart from the edge of the second conductivity type semiconductor layer 116, e.g., along the Y direction. That is, the opening 145o may extend in a sight direction (into the page) in FIG. 5. In this case, a contact portion between the second electrode 127 and the second conductivity type semiconductor layer 116 may extend along, e.g., parallel to, an edge of the upper surface of the second conductivity type semiconductor layer 116 apart from the edge of the upper surface thereof.

A seed layer extension 129, which is continuous with the second electrode 127, may extend by a predetermined length along the upper surface of the second conductivity type semiconductor layer 116 with the insulating layer 145 therebetween. The seed layer extension 129 may protrude from a sidewall of the partition wall body 122 by a first distance d1 in a lateral direction, e.g., along the Y direction.

The seed layer 124, the second electrode 127, and the seed layer extension 129 may be integrally formed, e.g., as a uniform and seamless structure formed of a same material. For example, as illustrated in FIG. 5, upper surfaces of the seed layer 124 and the seed layer extension 129 may be coplanar.

An end of the seed layer extension 129 may be located a second distance d2 apart from an edge of the upper surface of the second conductivity type semiconductor layer 116. In some embodiments, the second distance d2 may range from about 0.01 μm to about 5 μm. If the second distance d2 is excessively great, an area from which light is emitted by the semiconductor light-emitting device 100 may be excessively reduced, thereby degrading light extraction efficiency. If the second distance d2 is excessively small, forming the second electrode 127 may be difficult.

Although FIG. 5 illustrates a case in which the second electrode 127 is in direct contact with the second conductivity type semiconductor layer 116, an ohmic contact layer may be further provided between the second electrode 127 and the second conductivity type semiconductor layer 116. The ohmic contact layer may include a metal, e.g., silver (Ag), gold (Au), and aluminum (Al), or a transparent conductive oxide, e.g., indium tin oxide (ITO), zinc indium oxide (ZIO), and gallium indium oxide (GIO). In some embodiments, the ohmic contact layer may include a transmissive electrode. The transmissive electrode may include any one of a transparent conductive oxide layer and a nitride layer. For example, the ohmic contact layer may include at least one of indium tin oxide (ITO), zinc-doped ITO (ZITO), zinc indium oxide (ZIO), gallium indium oxide (GIG), zinc tin oxide (ZTO), fluorine-doped tin oxide (FTO), aluminum-doped zinc oxide (AZO), gallium-doped zinc oxide (GZO), $In_4Sn_3O_{12}$, and zinc magnesium oxide ($Zn_{(1-x)}Mg_xO$, $0 \leq x \leq 1$). When necessary, the ohmic contact layer may include graphene.

Although FIG. 5 illustrates a case in which the sidewall of the partition wall body 122 is located on the second electrode 127, embodiments are not limited thereto. In some embodiments, the sidewall of the partition wall body 122 may be located on the seed layer extension 129. In some other embodiments, the sidewall of the partition wall body 122 may be located on the seed layer 124 formed on the upper surface of the second conductivity type semiconductor layer 116.

The partition wall body 122 may include an electrically conductive material, e.g., a metal. The partition wall body 122 may surround side surfaces of the plurality of semiconductor light-emitting devices 100 as shown in FIG. 3. That is, all the partition wall bodies 122 shown in FIG. 5 may be substantially electrically connected to each other and electrically connected to the respective semiconductor light-emitting devices 100 through the second electrodes 127 corresponding thereto. Also, the partition wall body 122 may be connected to the controller 190 through a second connection electrode 139, as illustrated in FIG. 4.

In some embodiments, the partition wall body 122 may include, e.g., copper (Cu), tin (Sn), gold (Au), silver (Ag), platinum (Pt), aluminum (Al), iron (Fe), cobalt (Co), nickel (Ni), indium (In), bismuth (Bi), antimony (Sb), zinc (Zn), lead (Pb), and/or an alloy thereof.

As described above, the partition wall body 122 may protrude by about 0.1 μm to about 50 μm from the upper surface of the second conductivity type semiconductor layer 116 in a vertical direction (i.e., a +Z direction). If a protruding degree of the partition wall body 122 is excessively small, the partition wall body 122 may not effectively function as a partition wall to separate emitted light. Conversely, if the protruding degree of the partition wall body 122 is excessively large, a thickness of the semiconductor light-emitting device 100 may be increased, and light extraction efficiency may be reduced.

The partition wall structure 120 may extend to a lower level than the lower surface of the first conductivity type semiconductor layer 112 in a vertical direction (i.e., a −Z direction). That is, a lower surface of the partition wall structure 120 may be closer to the circuit substrate 180 than the lower surface of the first conductivity type semiconductor layer 112, e.g., a distance between the lower surface of the partition wall structure 120 and the bottom of the circuit substrate 180 may be smaller than a distance between the lower surface of the first conductivity type semiconductor layer 112 and the bottom of the circuit substrate 180. Although the lower surface of the partition wall structure 120 is at a lower level than the lower surface of the first conductivity type semiconductor layer 112, the lower surface of the partition wall structure 120 may not be in contact with the first electrode 131 but be located apart from the first electrode 131. In particular, the partition wall structure 120 may be spaced apart from the first electrode 131 by at least the insulating layer 145.

Referring back to FIGS. 3 and 4, the partition wall structure 120 may define the pixel area PA, and light may be emitted through the pixel area PA. For example, as illustrated in FIG. 3, the partition wall structure 120 may completely surround a perimeter of each of each pixel area PA in a top view. Meanwhile, a total planar area of the pixel area PA may be less than a total planar area of the upper surface of the second conductivity type semiconductor layer 116, i.e., a surface of the second conductivity type semiconductor layer 116 facing away from the active layer 114, since a portion of the upper surface of the second conductivity type semiconductor layer 116 near an edge thereof is covered by the seed layer 124, the second electrode 127, and the seed layer extension 129, as described above with reference to FIG. 5.

Figure 6:
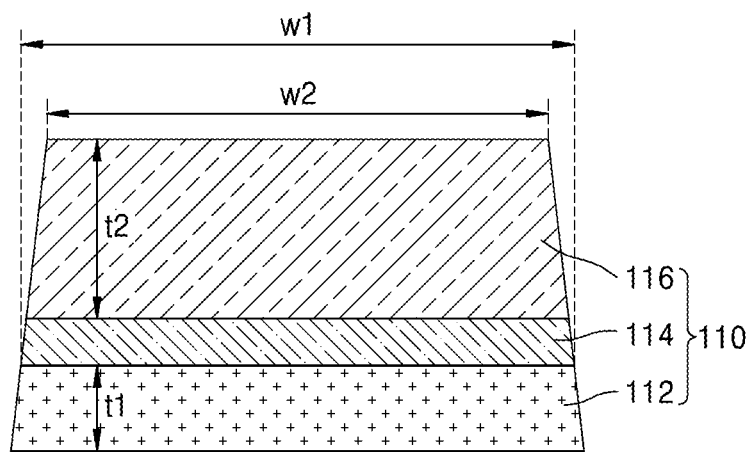
FIG. 6 is a side view separately illustrating only a light-emitting device structure of FIG. 4.

FIG. 6 is a side view separately illustrating only the light-emitting device structure 110 of FIG. 4.

Referring to FIG. 6, the first conductivity type semiconductor layer 112 may have a first thickness t1 in a vertical direction, and the second conductivity type semiconductor layer 116 may have a second thickness t2 in the vertical direction. The second thickness t2 may be greater than the first thickness t1. Since the second conductivity type semiconductor layer 116 located on the active layer 114 has a greater thickness than the first conductivity type semiconductor layer 112 or the active layer 114, a side surface of the active layer 114 may be exposed to an anisotropic etchant (e.g., plasma gas) for a relatively short time during the formation of the light-emitting device structure 110. That is, the side surface of the active layer 114 may be exposed to the anisotropic etchant only during the formation of the first conductivity type semiconductor layer 112 having the first thickness t1 that is less than the second thickness t2.

If the first thickness t1 were to be greater than the second thickness t2 (i.e., t1>t2), the side surface of the active layer 114 would have been exposed to the anisotropic etchant (e.g., the plasma gas) for a relatively long time during the formation of the light-emitting device structure 110 due to the fact that the side surface of the active layer 114 needs to be continuously exposed to the anisotropic etchant during the formation of the first conductivity type semiconductor layer 112 with the first thickness t1. Therefore, the reduced first thickness t1, e.g., relative to the second thickness t2, may reduce exposure of the active layer 114 to the anisotropic etchant.

A width w1 of an upper surface of the first conductivity type semiconductor layer 112 may be greater than a width w2 of the upper surface of the second conductivity type semiconductor layer 116. Also, a width of the lower surface of the first conductivity type semiconductor layer 112 may be greater than the width w1. In addition, a width of a lower surface of the second conductivity type semiconductor layer 116 may be greater than the width w2 and less than the width w1. In other words, a width of the light-emitting device structure 110 may be reduced in a vertical upward direction (i.e., the +Z direction). For example, as illustrated in FIG. 6, the light-emitting device structure 110 may have a trapezoidal cross-section with gradually decreasing width in a direction oriented from the first conductivity type semiconductor layer 112 toward the second conductivity type semiconductor layer 116.

Figure 7:
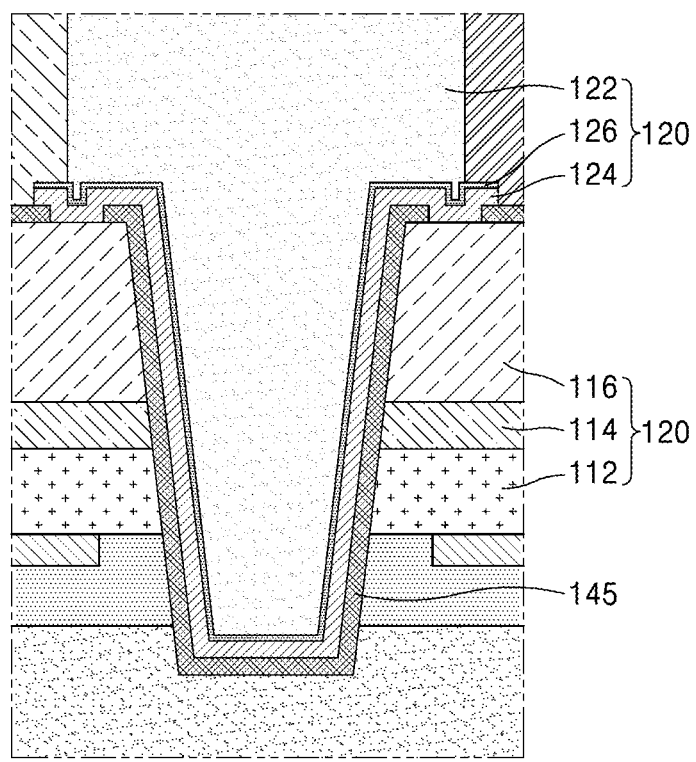
FIG. 7 is a partial enlarged view of a partition wall structure and a periphery thereof according to an embodiment.

FIG. 7 is a partial enlarged view of the partition wall structure 120' and a periphery thereof according to an embodiment, which corresponds to region VII of FIG. 4.

Referring to FIG. 7, the partition wall structure 120' may further include a barrier layer 126 between the partition wall body 122 and the seed layer 124. The barrier layer 126 may prevent diffusion of atoms or ions of a material included in the partition wall body 122 into the seed layer 124 or the insulating layer 145. In particular, when the partition wall body 122 includes, e.g., copper, the barrier layer 126 may prevent copper atoms from diffusing into another layer or region. In some embodiments, the barrier layer 126 may facilitate the adhesion of the partition wall body 122 to the seed layer 124.

In some embodiments, the barrier layer 126 may include, e.g., nickel (Ni), cobalt (Co), copper (Cu), titanium (Ti), titanium nitride (TiN), tantalum (Ta), tantalum nitride (TaN), manganese (Mn), manganese oxide (MnO), manganese nitride (MnN), ruthenium (Ru), ruthenium oxide (RuO), ruthenium nitride (RuN), or a combination thereof.

Referring back to FIGS. 3 and 4, encapsulation layers 150, 150a, and 150b may be provided on the second conductivity type semiconductor layer 116 on which the pixel area PA is defined by the partition wall structure 120. For example, as illustrated in FIG. 4, the encapsulation layers 150, 150a, and 150b may completely cover and overlap corresponding pixel area PA. At least one of the encapsulation layers 150, 150a, and 150b may include a wavelength converting material. The wavelength converting material may be a material for converting a wavelength of light emitted by the light-emitting device structure 110. Various materials, e.g., phosphors and/or quantum dots (QDs), may be used as the wavelength converting material.

Figure 8:
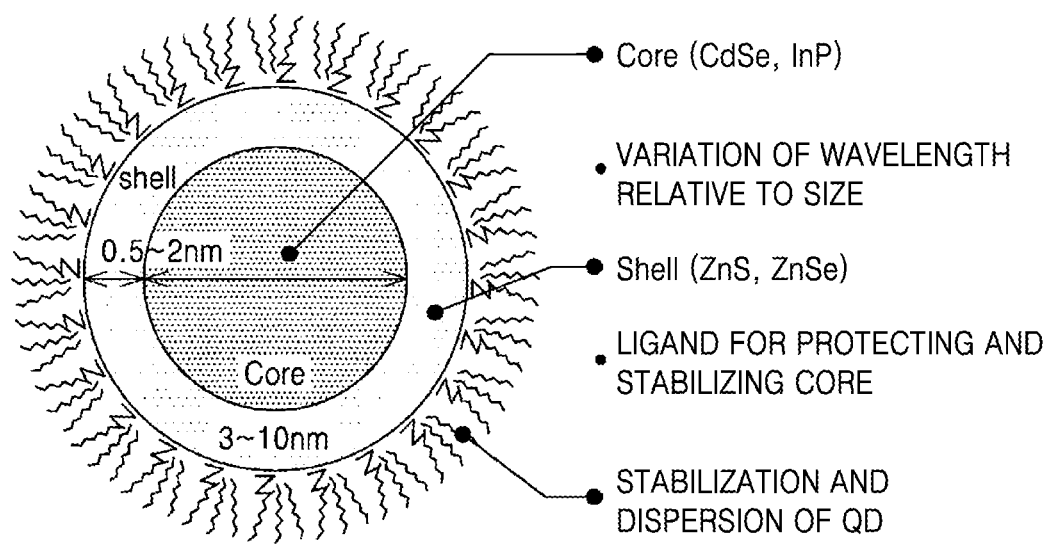
FIG. 8 is a schematic diagram of a cross-sectional structure of a quantum dot (QD) that may be used as a wavelength converting material in a semiconductor light-emitting device according to example embodiments.

FIG. 8 is a schematic diagram illustrating a cross-sectional structure of a QD that may be used as a wavelength converting material in a semiconductor light-emitting device 100 according to example embodiments. Referring to FIG. 8, the QD may have a core-shell structure using a Group III-V or II-VI compound semiconductor. For example, the QD may have a core, e.g., cadmium selenide (CdSe) or indium phosphide (InP), and a shell, e.g., zinc sulfide (ZnS) or zinc selenide (ZnSe). In addition, the QD may include a ligand for stabilizing the core and the shell. For example, the diameter of the core may be about 1 nm to about 30 nm, e.g., about 3 nm to about 10 nm. The thickness of the shell may be about 0.1 nm to about 20 nm, e.g., about 0.5 nm to about 2 nm.

The QD may realize various colors depending on its size. In particular, when the QD is used as a substitute for a phosphor, the QD may be used as a wavelength converting material. By using the QD, a narrow full-width at half-maximum (for example, about 35 nm) may be realized.

The wavelength converting material may be included in the encapsulation layers 150, 150a, and 150b (refer to FIG. 4). However, in another case, the wavelength converting material may be previously formed as a film type and adhered to a surface of an optical structure, e.g., a light-emitting diode (LED) chip or a light guide plate (LPG). In this case, the wavelength converting material may have a structure having a uniform thickness and be easily applied to a desired region.

FIGS. 1 to 8 illustrate an example in which one pixel chip includes three sub-pixels, but embodiments are not limited thereto.

Figure 9:
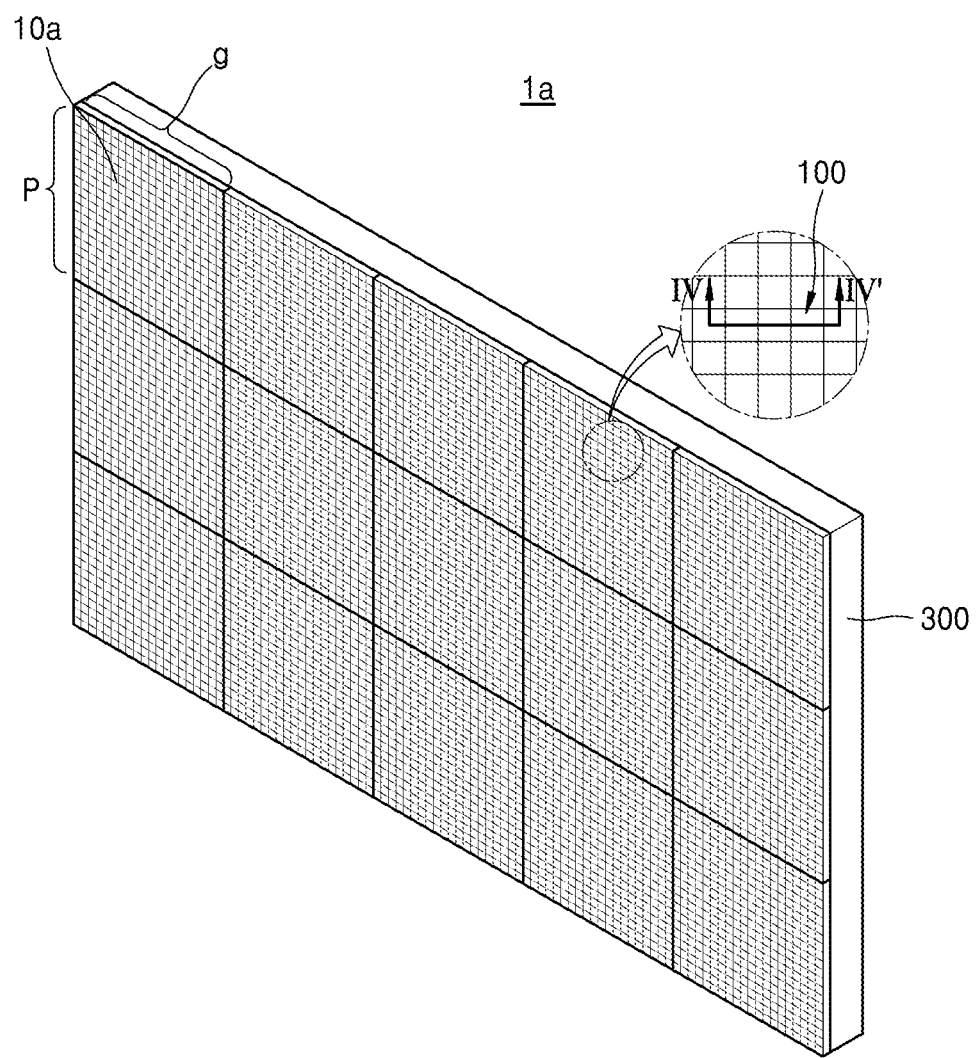
FIG. 9 is a perspective view of a display device according to an embodiment.

FIG. 9 is a perspective view of a display device 1a according to an embodiment.

Referring to FIG. 9, the display device 1a may include a plurality of light-emitting device packages 10a. The display device 1a may include m light-emitting device packages 10a in a first direction (e.g., a lateral direction) and include n light-emitting device packages 10a in a second direction (e.g., a longitudinal direction) perpendicular to the first direction (m≥1, n≥1, and m+n≥2).

The light-emitting device package 10a may include a multi-pixel chip in which light-emitting devices 100 are arranged in p rows and q columns. In some embodiments, from among the p×q light-emitting devices 100 of the light-emitting device package 10a, 3×1 light emitting devices 100, 2×2 light-emitting devices 100, or 1×3 light-emitting devices 100 may be combined into one sub-pixel or one pixel. When at least two light-emitting devices 100 are combined into one sub-pixel, at least two sub-pixels (e.g., three neighboring sub-pixels) may be combined into one pixel.

In some embodiments, a cross-section taken along a line IV-IV' of FIG. 9 may correspond to the cross-sectional view shown in FIG. 4. In some embodiments, one first connection electrode (refer to 135 in FIG. 4) may be included in each of the light-emitting devices 100. In other embodiments, the first connection electrode 135 may be included in each of the light-emitting devices 100 and shared with corresponding light-emitting devices 100 of adjacent pixels or sub-pixels.

Figure 10:
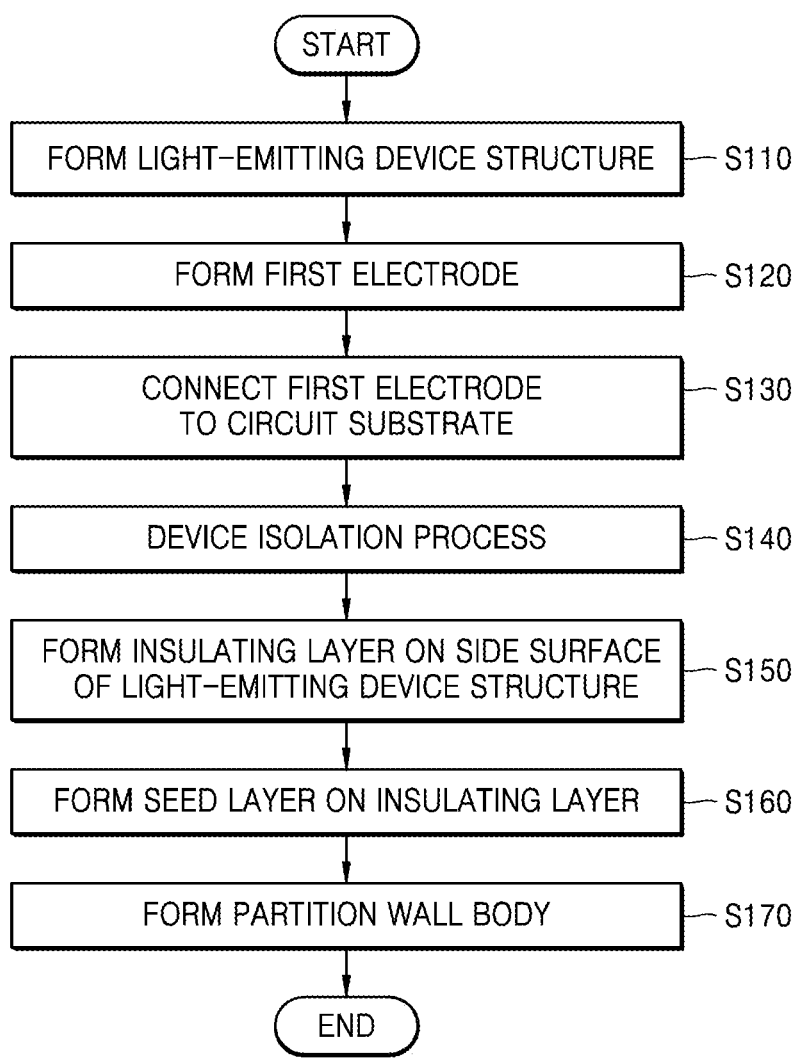
FIG. 10 is a flowchart illustrating a method of manufacturing a semiconductor light-emitting device, according to an embodiment.
Figure 11A:
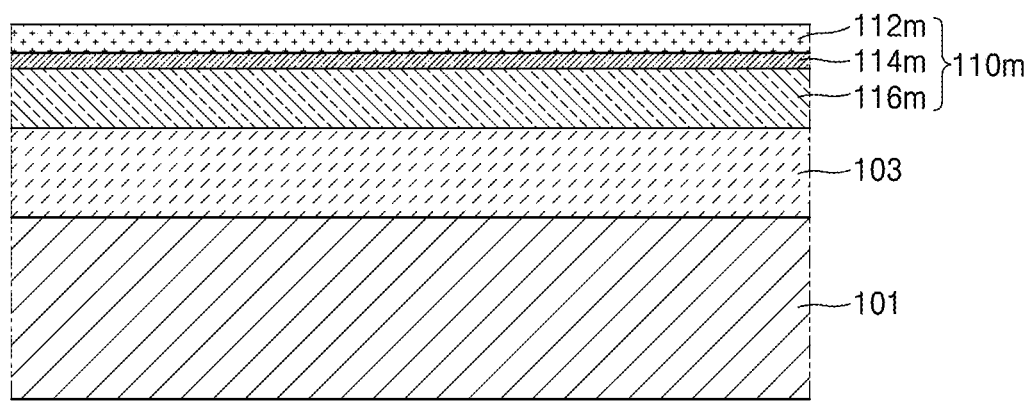
FIGS. 11A to 11N are cross-sectional views of a method of manufacturing a semiconductor light-emitting device, according to an embodiment.

FIG. 10 is a flowchart illustrating a method of manufacturing a semiconductor light-emitting device, according to an embodiment. FIGS. 11A to 11N are cross-sectional views illustrating stages in a method of manufacturing a semiconductor light-emitting device, according to an embodiment.

Referring to FIGS. 10 and 11A, a buffer layer 103 and a light-emitting device structure layer 110m may be sequentially formed on a growth substrate 101 (S110).

The growth substrate 101 may include an insulating substrate including, e.g., sapphire. However, the growth substrate 101 is not limited to the insulating substrate and may include a conductive substrate or a semiconductor substrate. For example, in addition to sapphire, the growth substrate 101 may include silicon carbide (SiC), silicon (Si), magnesium aluminate (MgAl$_2$O$_4$), magnesium oxide (MgO), lithium aluminate (LiAlO$_2$), lithium gallate (LiGaO$_2$), or gallium nitride (GaN).

The buffer layer 103 may be formed on the growth substrate 101. The buffer layer 103 may include a layer on which a high-quality nitride stacked body with few cracks and dislocations is to be formed. The buffer layer 103 may include a plurality of nitride semiconductor layers. The buffer layer 103 may include In$_x$Al$_y$Ga$_{1-x-y}$N (0≤x≤1 and 0≤y≤1). For example, the buffer layer 103 may include GaN, AlN, AlGaN, and/or InGaN. When necessary, the buffer layer 103 may be formed by combining a plurality of layers or gradually varying a composition of a layer. In some embodiments, the buffer layer 103 may be formed using an epitaxial growth process. In some embodiments, the buffer layer 103 may be formed using, e.g., a metal-organic chemical vapor deposition (MOCVD) process.

Thereafter, a second conductivity type semiconductor film 116m, an active film 114m, and a first conductivity type semiconductor film 112m may be sequentially formed on the buffer layer 103. In this case, a thickness of the second conductivity type semiconductor film 116m may be greater than a thickness of the first conductivity type semiconductor film 112m.

The second conductivity type semiconductor film 116m, the active film 114m, and the first conductivity type semiconductor film 112m may be formed using an epitaxial growth process. Also, since components and compositions of the second conductivity type semiconductor film 116m, the active film 114m, and the first conductivity type semiconductor film 112m have been described in detail with reference to FIG. 4, a repeated description thereof will be omitted.

Figure 11B:
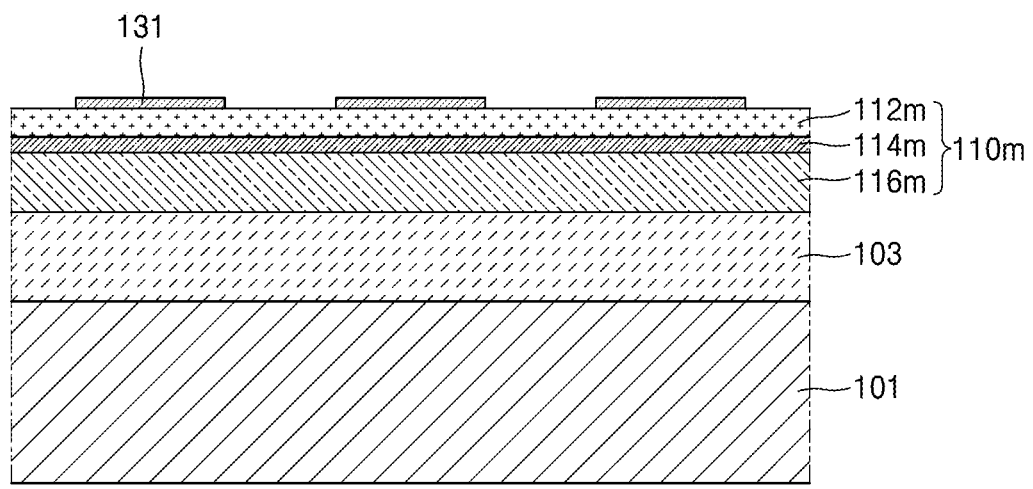

Referring to FIGS. 10 and 11B, a first electrode 131 may be formed on the first conductivity type semiconductor film 112m (S120).

To form the first electrode 131, a first electrode material layer may be initially formed on the first conductivity type semiconductor film 112m. The first electrode material layer may include, e.g., silver, aluminum, nickel, chromium, copper, gold, palladium, platinum, tin, tungsten, rhodium, iridium, ruthenium, magnesium, zinc, and a combination thereof. The first electrode material layer may be formed using, e.g., a chemical vapor deposition (CVD) process, a physical vapor deposition (PVD) process, or an atomic layer deposition (ALD) process, but a forming method thereof is not limited thereto.

Thereafter, an etch mask for a patterning process may be formed on the first electrode material layer. The etch mask may be an inorganic hard mask, e.g., a silicon oxide mask, a silicon nitride mask, a spin-on hardmask (SOH), and an amorphous carbon layer (ACL), or a photoresist mask. Next, the first electrode material layer may be etched using the etch mask to form the first electrode 131. In some embodiments, the first electrode 131 may be formed using a lift-off process.

Figure 11C:
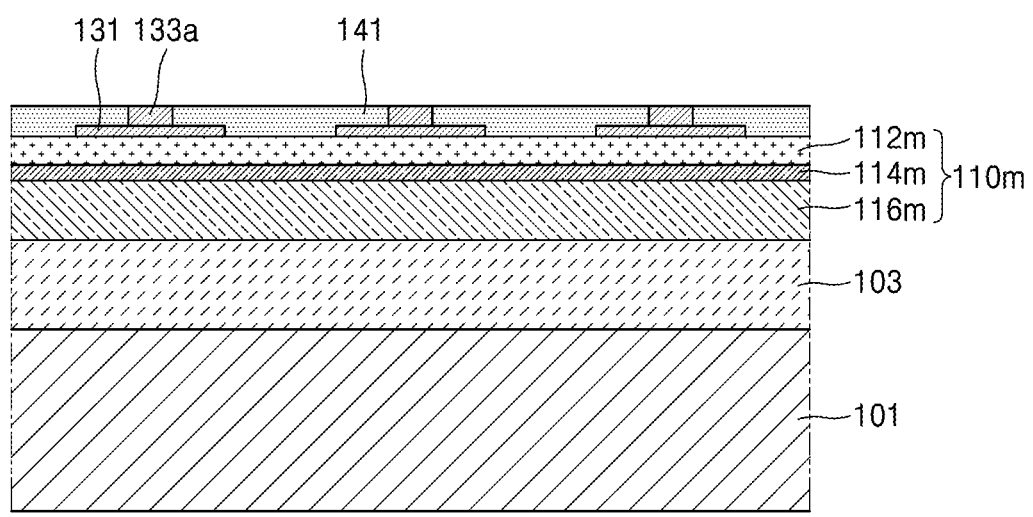

Referring to FIG. 11C, the first electrode 131 may be coated with the first interlayer insulating film 141. Since a composition of the first interlayer insulating film 141 has been described with reference to FIG. 4, a repeated description thereof will be omitted. In some embodiments, the first interlayer insulating film 141 may include silicon oxide and be formed by spin-coating spin-on glass (SOG) and curing the SOC. In some embodiments, the first interlayer insulating film 141 may be formed using a CVD process, a PVD process, or an ALD process.

Next, a contact hole for forming a contact in the first interlayer insulating film 141 may be formed in the first interlayer insulating film 141. To this end, the contact hole partially exposing the first electrode 131 may be formed in the first interlayer insulating film 141 using, e.g., a photolithography process.

Thereafter, a seed layer may be formed, and a plating process may be performed to form a contact plug filling the contact hole. The contact plug may be planarized and defined inside the contact hole. Thus, the upper sub-contact 133a described with reference to FIG. 4 may be obtained.

Figure 11D:
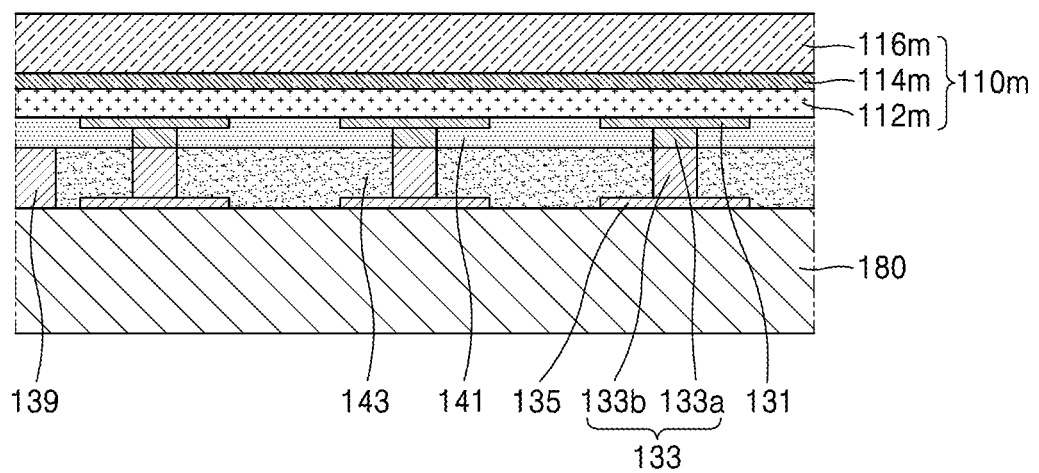

Referring to FIGS. 10 and 11D, the first electrode 131 may be electrically connected to the circuit substrate 180 including a control circuit (S130).

The circuit substrate 180 may include a controller (refer to FIG. 4) having the control circuit. Also, the first electrode 131 may be connected to the controller through the first connection electrode 135 of the circuit substrate 180.

The circuit substrate 180 may be, e.g., a printed circuit board (PCB) or a semiconductor device in which semiconductor devices are provided on a semiconductor substrate. The circuit substrate 180 may include lower sub-contacts 133b corresponding respectively to the upper sub-contacts 133a. The circuit substrate 180 may further include the second connection electrode 139 to be subsequently connected to a partition wall structure.

In some embodiments, the upper sub-contacts 133a may be combined with the lower sub-contacts 133b using a eutectic bonding process. In this case, when the upper sub-contacts 133a are not completely aligned with the lower sub-contacts 133b, step portions may be formed at sidewalls of first contacts 133.

In some embodiments, the upper sub-contacts 133a may be bonded to the lower sub-contacts 133b by using a connection conductor. For example, the connection conductor may include a solder ball, solder paste, or an anisotropic conductive film (ACF), but is not specifically limited.

The first connection electrode 135, the second connection electrode 139, and the lower sub-contacts 133b may be electrically connected to the controller (refer to FIG. 4) included in the circuit substrate 180 and formed in the second interlayer insulating film 143 formed on the circuit substrate 180. However, the configuration shown in FIG. 11D is only an example, and embodiments not limited thereto.

Afterwards, the growth substrate 101 and the buffer layer 103 may be removed. The removal of the growth substrate 101 and the buffer layer 103 may be performed using, e.g., a grinding process or a laser lift-off process. However, embodiments are not limited thereto.

Figure 11E:
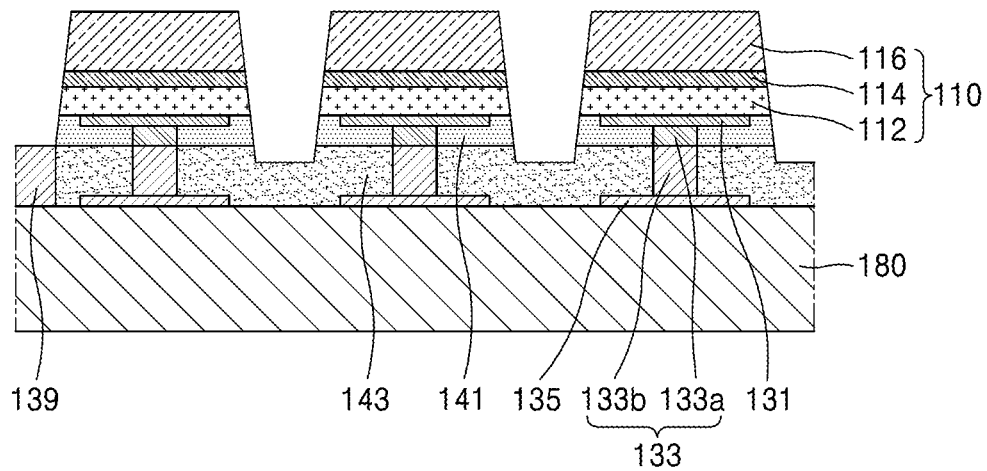
Figure 11F:
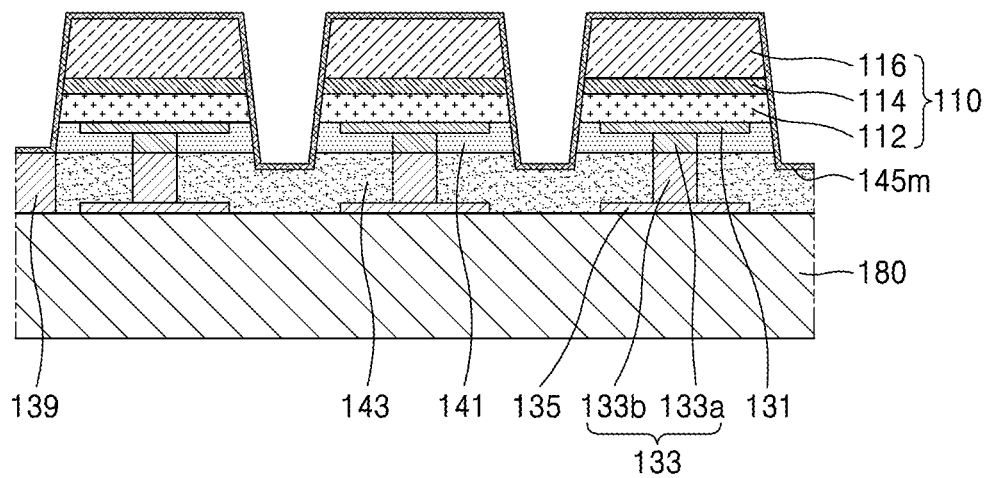

Referring to FIGS. 10 and 11E, a device isolation process may be performed to isolate individual semiconductor light-emitting device structures from each other (S140).

An etch mask may be formed on the second conductivity type semiconductor film 116m (refer to FIG. 11D), e.g., the etch mask may include portions spaced apart from each other and overlapping respective first electrodes 131. The second conductivity type semiconductor film 116m, the active film 114m, and the first conductivity type semiconductor film 112m may be sequentially etched through the etch mask using an anisotropic etching process to perform the device isolation process. As a result of the device isolation process, the first conductivity type semiconductor layer 112, the active layer 114, and the second conductivity type semiconductor layer 116, which belong to each of the individual semiconductor light-emitting device structures 110, may be obtained. For example, as illustrated in FIG. 1E, each of the semiconductor light-emitting device structures 110 may include a stack of the first conductivity type semiconductor layer 112, the active layer 114, and the second conductivity type semiconductor layer 116 on the first electrode 131.

In some embodiments, the anisotropic etching process may be performed using the second connection electrode 139 as an etch stop film. That is, when the semiconductor light-emitting devices are isolated from each other due to the anisotropic etching process, an upper surface of the second connection electrode 139 may be exposed.

As shown in FIG. 11E, the first electrode 131 may be surrounded by the first interlayer insulating film 141. As described above with reference to FIG. 6, since a vertical thickness of the second conductivity type semiconductor layer 116 is greater than a vertical thickness of the first conductivity type semiconductor layer 112, damage to the active layer 114 may be reduced during the device isolation process.

Film

Figure 11G:
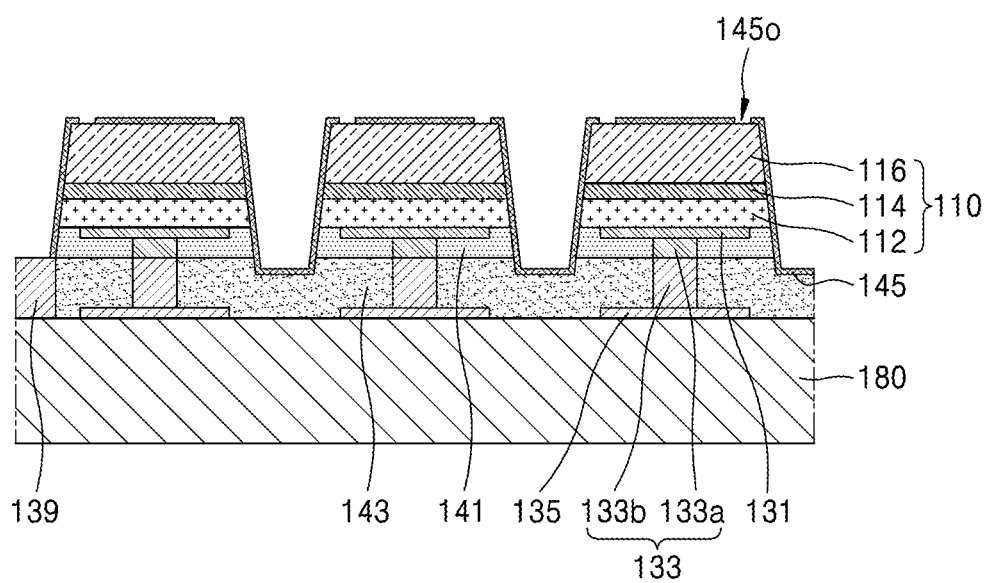

Referring to FIG. 11G, the opening 145o may be formed in the insulating film 145m formed on the upper surface of the second conductivity type semiconductor layer 116 to form the insulating layer 145. The upper surface of the second conductivity type semiconductor layer 116 may be partially exposed by the opening 145o. For example, as illustrated in FIG. 11G, two openings 145o spaced apart from each other may be formed on each of the light-emitting device structures 110.

The formation of the opening 145o may be performed using a photolithography process. In some embodiments, the opening 145o may have a trench shape extending along an edge of the second conductivity type semiconductor layer 116. However, embodiments are not limited thereto.

In addition, during the formation of the opening 145o, a portion of the insulating film 145m may be removed to expose the second connection electrode 139.

Figure 11H:
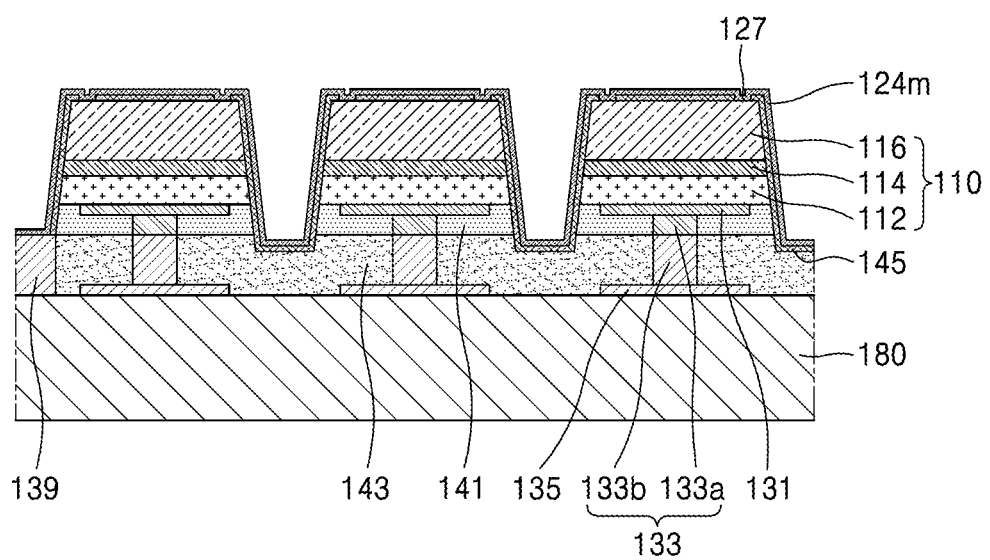
Figure 11I:
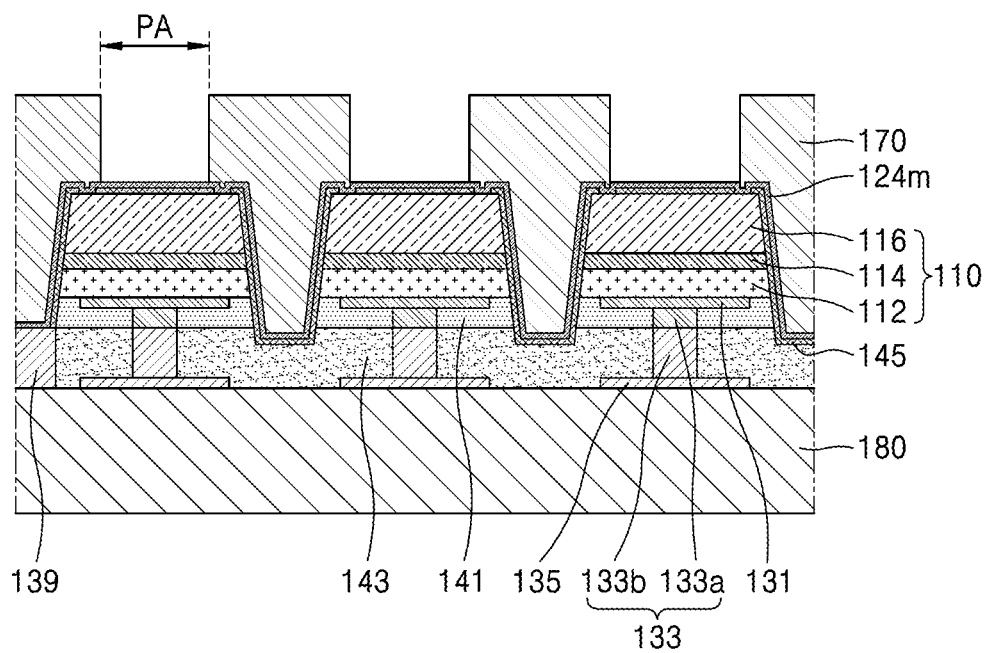

Referring to FIGS. 10 and 11H, a seed film 124m may be conformally formed on the entire surface of the insulating layer 145 (S160). For example, as illustrated in FIG. 11H, the seed film 124m may be continuous and conformal on the entire insulating layer 145 to be conformal inside the opening 145o. The seed film 124m may be formed on the surface of the insulating layer 145, which is formed on the side surfaces and the upper surfaces of the light-emitting device structures 110. The seed film 124m may be formed using, e.g., a CVD process, a PVD process, or an ALD process.

In addition, the seed film 124m may be electrically connected to the upper surface of the second conductivity type semiconductor layer 116, which is exposed by the opening 145o. The seed film 124m may be formed to be in contact with the second conductivity type semiconductor layer 116 inside the opening 145o, thereby forming the second electrode 127 inside the opening 145o.

Moreover, the seed film 124m may be formed to be in contact with an upper surface of the second connection electrode 139.

Referring to FIG. 11, an etch mask 170 for defining the pixel area PA may be formed. The etch mask 170 may be formed using, e.g., a photoresist material.

The etch mask 170 may be formed to fill a recess space between two adjacent light-emitting device structures 110 and to expose an upper portion of the second conductivity type semiconductor layer 116, e.g., the etch mask 170 may cover only peripheral portions (e.g., edges) of each of the light-emitting device structures 110. As described with reference to FIG. 5, the pixel area PA may be determined by a region of the seed film 124m, which remains after the etching process, e.g., the pixel area PA may be determined by the exposed area of the seed film 124m between adjacent portions of the etch mask 170. A pattern of the etch mask 170 may be designed considering the pixel area PA.

Here, to prevent damage to a portion in which the second electrode (refer to 127 in FIG. 5) is formed, the etch mask 170 may be designed to coat, e.g., completely cover, the portion in which the second electrode 127 is formed.

Figure 11J:
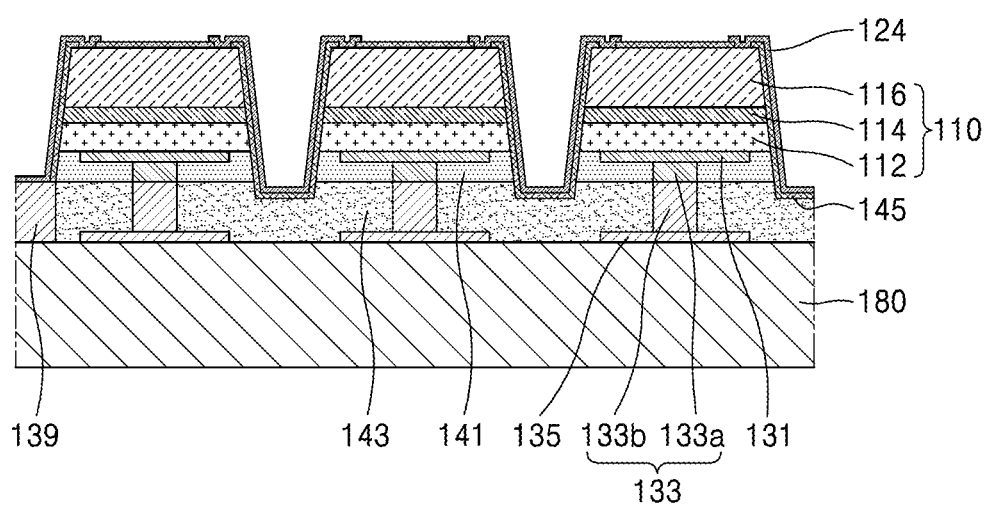

Referring to FIG. 11J, the seed film 124m, which is exposed between adjacent portions of the etch mask 170, may be removed using the etch mask 170 to form the seed layer 124. The removal of the seed film 124m, which is exposed, may be performed using, e.g., an anisotropic etching process. In some embodiments, the removal of the seed film 124m, which is exposed, may be performed using a wet isotropic etching process.

The insulating layer 145, which is located under a portion of the removed seed film 124m using the etching process, may be partially left or completely removed. Although FIG. 11J illustrates an example in which the insulating layer 145 remains under the removed portion of the seed film 124m, embodiments are not limited thereto.

Subsequently, the etch mask 170 may be removed. For example, the etch mask 170 may be removed using an ashing process in an oxidation atmosphere.

Figure 11K:
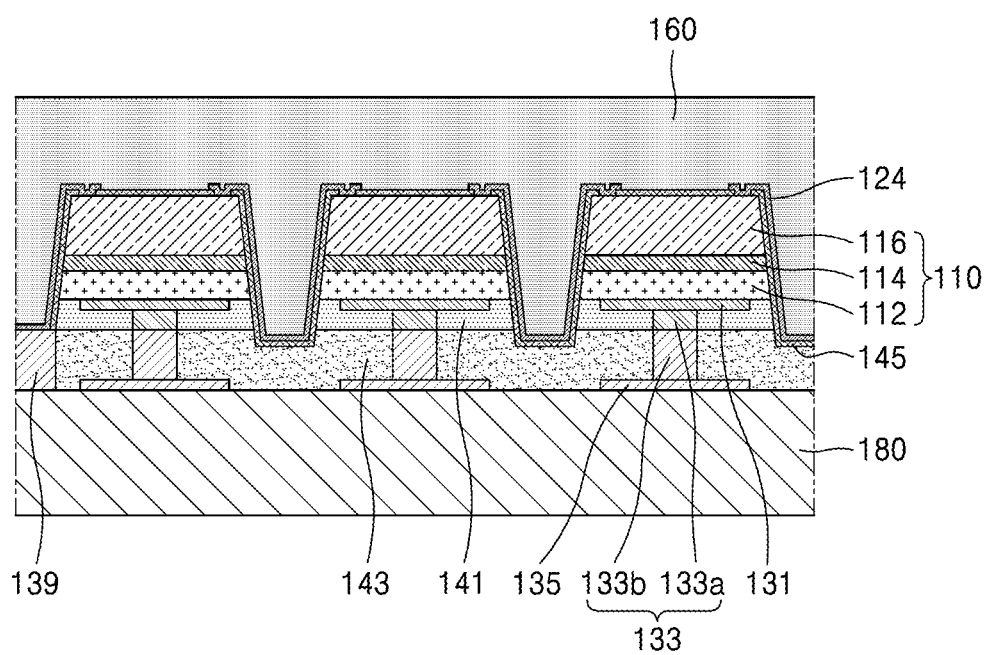

Referring to FIG. 11K, a mold material layer 160 may be formed on the entire surfaces of the seed layer 124 and the insulating layer 145. The mold material layer 160 may include, e.g., a photoresist material. For example, the mold material layer 160 may be formed by spin-coating photoresist.

Figure 11L:
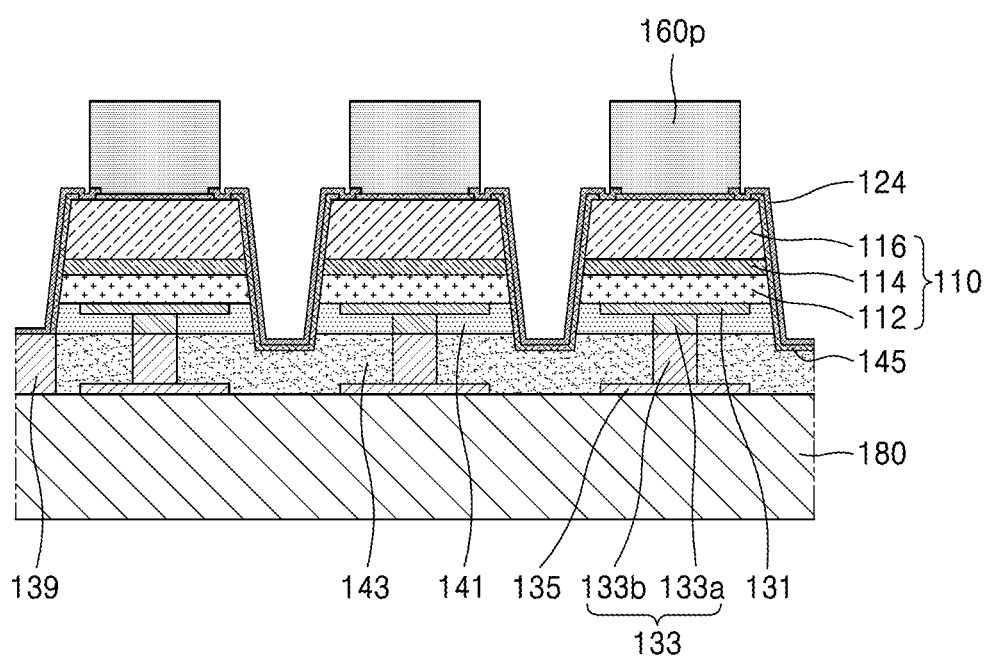

Referring to FIG. 11L, the mold material layer 160 may be patterned to form a mold pattern 160p, e.g., in regions exposed by the seed layer 124. The mold material layer 160 may be patterned by exposing and developing a photoresist material film.

Since a partition wall body 122 will be subsequently formed on a surface of the seed layer 124, which is exposed by the mold pattern 160p, using a subsequent plating process, the mold pattern 160p may be designed considering the subsequent formation of the partition wall body 122.

Figure 11M:
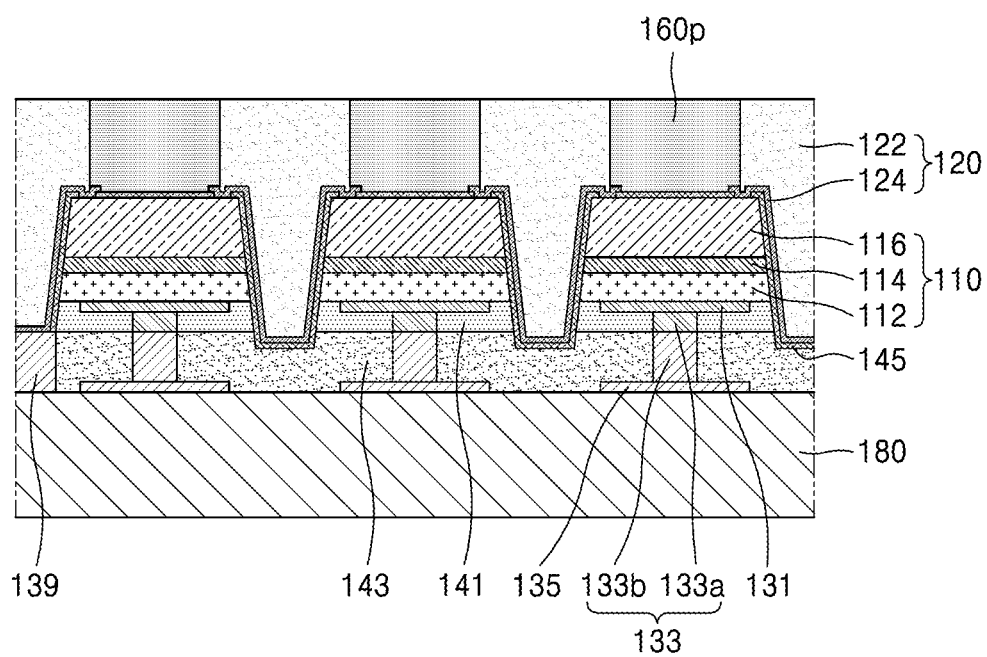
Figure 11N:
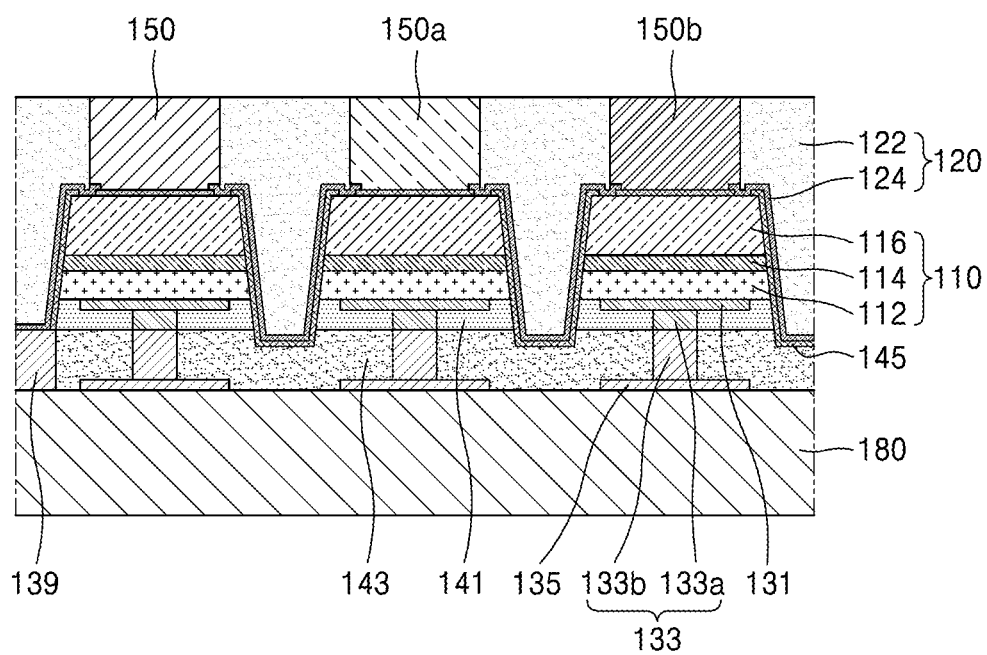

Referring to FIGS. 10 and 11M, the partition wall body 122 may be formed using a plating process on the seed layer 124, which is exposed by the mold pattern 160p (S170). The plating process may include an electroplating process or an electroless plating process.

An upper surface of a partition wall body formed using a plating process may be planarized to form the partition wall body 122 having a constant level. The planarization of the upper surface of the partition wall body may be performed considering a protruding degree of the partition wall body 122 over the upper surface of the second conductivity type semiconductor layer 116.

By forming the partition wall body 122, the formation of a partition wall structure 120 may be completed. The partition wall structure 120 may be electrically connected to the second connection electrode 139 and function as one common electrode as described with reference to FIG. 3.

Referring to FIG. 11N, the mold pattern 160p may be removed, and the encapsulation layers 150, 150a, and 150b may be formed in pixel spaces defined by the partition wall structure 120 on the second conductivity type semiconductor layer 116. Each of the encapsulation layers 150, 150a, and 150b may include a phosphor.

For example, the encapsulation layer 150b may include a red QD, and the encapsulation layer 150a may include a green QD. In some embodiments, a blue light filter configured to absorb blue light and inhibit the emission of blue light may be further provided on the encapsulation layer 150b and the encapsulation layer 150a.

By way of summation and review, it is necessary to develop semiconductor light-emitting devices having improved electrical properties and simple structures capable of reducing defects in products. Therefore, embodiments provide a semiconductor light-emitting device having excellent electrical properties. Embodiments also provide a method of manufacturing a semiconductor light-emitting device, by which semiconductor light-emitting devices may be efficiently manufactured without causing defects in products.

That is, a semiconductor light-emitting device according to embodiments may have a simplified structure by using partition walls as electrodes. Further, in the method of manufacturing a semiconductor light-emitting device, according to embodiments, damage to an active layer may be reduced by reversing the n-type and p-type etching directions to reduce the time period for which an active layer is exposed to an etchant during an etching process, thereby preventing or substantially minimizing the deterioration of electrical properties may be prevented. Thus, semiconductor light-emitting devices having excellent electrical properties may be obtained.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor light-emitting device, comprising:
   a plurality of light-emitting device structures separated from each other, each of the plurality of light-emitting device structures including:
   a first conductivity type semiconductor layer,
   an active layer on the first conductivity type semiconductor layer,
   a second conductivity type semiconductor layer on the active layer,
   a first electrode connected to the first conductivity type semiconductor layer, and
   a second electrode connected to the second conductivity type semiconductor layer; and
   a partition wall structure between two adjacent light-emitting device structures of the plurality of light-emitting device structures, the partition wall structure defining a pixel space,
   wherein the partition wall structure is continuous with the second electrode of each of adjacent light-emitting device structures of the plurality of light-emitting structures, the second electrode of each of the plurality of light-emitting device structures being continuous with a conductive portion of the partition wall structure.

2. The semiconductor light-emitting device as claimed in claim 1, wherein a lateral width of the first conductivity type semiconductor layer is greater than a lateral width of the second conductivity type semiconductor layer.

3. The semiconductor light-emitting device as claimed in claim 2, wherein a vertical thickness of the first conductivity type semiconductor layer is less than a vertical thickness of the second conductivity type semiconductor layer.

4. The semiconductor light-emitting device as claimed in claim 1, wherein the partition wall structure surrounds a side surface of the second conductivity type semiconductor layer and protrudes over an upper surface of the second conductivity type semiconductor layer.

5. The semiconductor light-emitting device as claimed in claim 4, further comprising an encapsulation layer in a space defined by the partition wall structure on the second conductivity type semiconductor layer.

6. The semiconductor light-emitting device as claimed in claim 4, wherein the partition wall structure protrudes by about 0.1 μm to about 50 μm from the upper surface of the second conductivity type semiconductor layer.

7. The semiconductor light-emitting device as claimed in claim 1, wherein the partition wall structure extends along side surfaces of the first conductivity type semiconductor layer, the active layer, and the second conductivity type semiconductor layer.

8. The semiconductor light-emitting device as claimed in claim 7, wherein the second electrode is on an upper surface of the second conductivity type semiconductor layer.

9. The semiconductor light-emitting device as claimed in claim 8, further comprising an insulating layer on the side surfaces of the first conductivity type semiconductor layer, the active layer, and the second conductivity type semiconductor layer,
   wherein the partition wall structure includes a seed layer extending along a surface of the insulating layer and a partition wall body on the seed layer.

10. The semiconductor light-emitting device as claimed in claim 9, wherein the partition wall body extends from an edge of the second conductivity type semiconductor layer to the second electrode along the upper surface of the second conductivity type semiconductor layer.

11. A semiconductor light-emitting device, comprising:
    a first conductivity type semiconductor layer;
    an active layer on the first conductivity type semiconductor layer;
    a second conductivity type semiconductor layer on the active layer;
    a first electrode connected to the first conductivity type semiconductor layer;
    an insulating layer on side surfaces of the first conductivity type semiconductor layer, the active layer, and the second conductivity type semiconductor layer; and
    a partition wall structure extending along the side surfaces of the first conductivity type semiconductor layer, the active layer, and the second conductivity type semiconductor layer with the insulating layer therebetween, the partition wall structure protruding to a higher level than an upper surface of the second conductivity type semiconductor layer,
    wherein the partition wall structure includes:
    a partition wall body extending in a direction perpendicular to the upper surface of the second conductivity type semiconductor layer, and
    a seed layer extension protruding from a side surface of the partition wall body and extending along the upper surface of the second conductivity type semiconductor layer.

12. The semiconductor light-emitting device as claimed in claim 11, wherein the first electrode extends along a lower surface of the first conductivity type semiconductor layer and is spaced apart from the partition wall structure.

13. The semiconductor light-emitting device as claimed in claim 11, wherein the partition wall structure extends along the side surfaces of the first conductivity type semiconductor layer, the active layer, and the second conductivity type semiconductor layer with the insulating layer therebetween, the partition wall structure extending to a lower level than a lower surface of the first conductivity type semiconductor layer.

14. The semiconductor light-emitting device as claimed in claim 11, wherein a distance between an end of the seed layer extension and an edge of the upper surface of the second conductivity type semiconductor layer ranges from about 0.01 μm to about 5 μm.

15. The semiconductor light-emitting device as claimed in claim 11, further comprising a second electrode connected to the second conductivity type semiconductor layer, a contact portion between the second electrode and the second conductivity type semiconductor layer extending along an edge of the upper surface of the second conductivity type semiconductor layer with a gap therebetween.

16. The semiconductor light-emitting device as claimed in claim 11, wherein the partition wall body extends to protrude by about 0.1 μm to about 50 μm from the upper surface of the second conductivity type semiconductor layer.

17. The semiconductor light-emitting device as claimed in claim 11, wherein the partition wall structure includes an electrical conductor.

18. The semiconductor light-emitting device as claimed in claim 17, wherein the partition wall structure further includes a barrier layer between a seed layer and the partition wall body.

19. A semiconductor light-emitting device, comprising:
a circuit substrate connected to a controller;
a plurality of light-emitting device structures on the circuit substrate and separated from each other;
a partition wall structure between two adjacent light-emitting device structures of the plurality of light-emitting device structures, the partition wall structure defining a pixel space; and
an encapsulation layer in contact with an upper surface of each of the plurality of light-emitting device structures and a sidewall of the partition wall structure,
wherein each of the plurality of light-emitting device structures includes:
a first conductivity type semiconductor layer on the circuit substrate,
an active layer on the first conductivity type semiconductor layer,
a second conductivity type semiconductor layer on the active layer,
a first electrode connected to the first conductivity type semiconductor layer, and
a second electrode connected to the second conductivity type semiconductor layer,
wherein side surfaces of the first conductivity type semiconductor layer, the active layer, and the second conductivity type semiconductor layer are coated with an insulating layer,
wherein the partition wall structure includes an electrical conductor and vertically extends along the side surfaces of the first conductivity type semiconductor layer, the active layer, and the second conductivity type semiconductor layer with the insulating layer therebetween,
wherein the partition wall structure is continuous with the second electrode of each of adjacent light-emitting device structures of the plurality of light-emitting structures, the second electrode of each of the plurality of light-emitting device structures being continuous with the electrical conductor and extending through the insulating layer to contact the second conductivity type semiconductor layer,
wherein an upper surface of the partition wall structure is farther from the circuit substrate than an upper surface of the second conductivity type semiconductor layer is, and a lower surface of the partition wall structure is closer to the circuit substrate than a lower surface of the first conductivity type semiconductor layer is, and
wherein the partition wall structure surrounds each of the plurality of light-emitting device structures with the insulating layer therebetween.

* * * * *